(12) United States Patent
Shang et al.

(10) Patent No.: US 12,002,407 B2
(45) Date of Patent: Jun. 4, 2024

(54) SHIFT REGISTER CIRCUIT INCLUDING DENOISING CONTROL SUB-CIRCUIT AND METHOD FOR DRIVING SAME, AND GATE DRIVING CIRCUIT AND DISPLAY APPARATUS

(71) Applicant: BOE TECHNOLOGY GROUP CO., LTD., Beijing (CN)

(72) Inventors: Guangliang Shang, Beijing (CN); Jiangnan Lu, Beijing (CN); Jie Zhang, Beijing (CN); Libin Liu, Beijing (CN); Shiming Shi, Beijing (CN); Dawei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/779,845

(22) PCT Filed: Apr. 22, 2021

(86) PCT No.: PCT/CN2021/089081
§ 371 (c)(1),
(2) Date: May 25, 2022

(87) PCT Pub. No.: WO2021/218779
PCT Pub. Date: Nov. 4, 2021

(65) Prior Publication Data
US 2023/0005415 A1      Jan. 5, 2023

(30) Foreign Application Priority Data

Apr. 29, 2020   (CN) .......................... 202010356184.0

(51) Int. Cl.
*G09G 3/3266*   (2016.01)
*G09G 3/20*     (2006.01)
*G11C 19/28*    (2006.01)

(52) U.S. Cl.
CPC ......... *G09G 3/2096* (2013.01); *G09G 3/3266* (2013.01); *G09G 3/20* (2013.01);
(Continued)

(58) Field of Classification Search
CPC ...... G09G 3/20; G09G 3/2096; G09G 3/3266; G09G 2300/0426; G09G 2310/0267;
(Continued)

(56) References Cited

U.S. PATENT DOCUMENTS

2005/0212746 A1    9/2005  Iwasaki et al.
2007/0001986 A1*   1/2007  Chen .................... G09G 3/3611
                                                345/100
(Continued)

FOREIGN PATENT DOCUMENTS

CN    105810166 A    7/2016
CN    105957470 A    9/2016
(Continued)

OTHER PUBLICATIONS

Extended European Search Report for corresponding European Application No. 21796531.8, dated Mar. 27, 2023, 12 pages.
(Continued)

*Primary Examiner* — Adam J Snyder
(74) *Attorney, Agent, or Firm* — Dority & Manning, P.A.

(57) ABSTRACT

A shift register circuit includes a denoising control sub-circuit and a denoising sub-circuit. The denoting control sub-circuit is configured to generate an alternating voltage signal according to a voltage of a first voltage terminal and a signal of a second clock signal terminal in response to a signal of a first clock signal terminal, to rectify the alternating voltage signal and then to output a signal to a first denoising control node, so that the voltage of the first denoting control node is maintained to be a voltage that enables the denoising sub-circuit to be turned on. The
(Continued)

denoting sub-circuit is configured to denoise a scan signal output terminal in response to a voltage of the first denoising control node being the voltage that enables the denoising sub-circuit to be turned on.

18 Claims, 14 Drawing Sheets

(52) U.S. Cl.
CPC .............. *G09G 2300/0426* (2013.01); *G09G 2310/0267* (2013.01); *G09G 2310/0286* (2013.01); *G09G 2310/08* (2013.01); *G09G 2320/0626* (2013.01); *G09G 2330/021* (2013.01); *G11C 19/28* (2013.01)

(58) Field of Classification Search
CPC ....... G09G 2310/0286; G09G 2310/08; G09G 2320/0626; G09G 2330/021; G11C 19/28
See application file for complete search history.

(56) References Cited

U.S. PATENT DOCUMENTS

| | | |
|---|---|---|
| 2009/0040203 A1 | 2/2009 | Kim et al. |
| 2010/0141641 A1 | 6/2010 | Furuta et al. |
| 2010/0164915 A1 | 7/2010 | Kim et al. |
| 2011/0148853 A1 | 6/2011 | Ko |
| 2012/0294411 A1 | 11/2012 | Duan |
| 2014/0056399 A1 | 2/2014 | Shang |
| 2014/0346520 A1 | 11/2014 | Kim et al. |
| 2014/0375616 A1* | 12/2014 | Kim ............. G09G 3/3266 345/76 |
| 2015/0035733 A1* | 2/2015 | Woo ............. G09G 3/3266 345/76 |
| 2015/0109279 A1 | 4/2015 | Gupta et al. |
| 2016/0125955 A1 | 5/2016 | Pang |
| 2016/0314850 A1 | 10/2016 | Gu et al. |
| 2016/0329015 A1* | 11/2016 | Ji ............. G09G 3/3225 |
| 2016/0365034 A1 | 12/2016 | Chan |
| 2017/0092212 A1 | 3/2017 | Wang |
| 2017/0193927 A1* | 7/2017 | Yang ............. G09G 3/3426 |
| 2018/0137808 A1 | 5/2018 | Na et al. |
| 2018/0357965 A1 | 12/2018 | Chung et al. |
| 2018/0366067 A1 | 12/2018 | Jang |
| 2019/0340975 A1 | 11/2019 | Zhai |
| 2020/0058362 A1 | 2/2020 | Xu et al. |
| 2020/0265877 A1 | 8/2020 | Zheng |
| 2021/0065599 A1 | 3/2021 | Feng |
| 2021/0082328 A1 | 3/2021 | Feng et al. |
| 2021/0150989 A1 | 5/2021 | Shi et al. |
| 2021/0335317 A1 | 10/2021 | Liu et al. |

FOREIGN PATENT DOCUMENTS

| | | |
|---|---|---|
| CN | 106157874 A | 11/2016 |
| CN | 108231032 A | 6/2018 |
| CN | 108806630 A | 11/2018 |
| CN | 111048032 A | 4/2020 |
| EP | 4068263 A1 | 10/2022 |

OTHER PUBLICATIONS

Chinese First Office Action (with English translation) for corresponding Chinese Application No. 202010356184.0, dated Dec. 3, 2020, 9 pages.
Lin et al., "Design of Bidirectional and Highly Stable Integrated Hydrogenated Amorphous Silicon Gate Driver Circuits", Journal of Display Technology, vol. 7, No. 1, Jan. 2011, pp. 10-18.
PCT International Search Report and Written Opinion (with English translation) for corresponding PCT Application No. PCT/CN2021/089081, dated Jul. 14, 2021, 21 pages.

* cited by examiner

SHIFT REGISTER CIRCUIT INCLUDING DENOISING CONTROL SUB-CIRCUIT AND METHOD FOR DRIVING SAME, AND GATE DRIVING CIRCUIT AND DISPLAY APPARATUS

CROSS-REFERENCE TO RELATED APPLICATIONS

The present disclosure is a national phase entry under 35 USC 371 of International Patent Application No. PCT/CN2021/089081 filed on Apr. 22, 2021, which claims priority to Chinese Patent Application No. 202010356184.0, filed on Apr. 29, 2020, which are incorporated herein by reference in their entirety.

TECHNICAL FIELD

The present disclosure relates to the field of display technologies, and in particular, to a shift register circuit and a method for driving the same, a gate driving circuit and a display apparatus.

BACKGROUND

With progress of display technologies, semiconductor element technology, which is a core of display apparatuses, has also progressed significantly. Organic light-emitting diodes (OLEDs), as current-type light-emitting devices, have been increasingly used in high-performance display apparatuses due to their characteristics such as self-luminescence, fast response, wide viewing angle, and being able to be manufactured on flexible substrates.

SUMMARY

In a first aspect, a shift register circuit is provided. The shift register circuit includes a denoising control sub-circuit and a denoising sub-circuit. The denoising control sub-circuit is coupled to a first voltage terminal, a first clock signal terminal, a second clock signal terminal and a first denoising control node. The denoising control sub-circuit is configured to: generate an alternating voltage signal according to a voltage of the first voltage terminal and a signal of the second clock signal terminal in response to a signal of the first clock signal terminal; rectify the alternating voltage signal; and then output a signal to the first denoising control node, so that a voltage of the first denoising control node is maintained to be a voltage that enables the denoising sub-circuit to be turned on. The denoising sub-circuit is coupled to the first denoising control node and a scan signal output terminal. The denoising sub-circuit is configured to denoise the scan signal output terminal in response to the voltage of the first denoising control node being the voltage that enables the denoising sub-circuit to be turned on.

In some embodiments, the denoising control sub-circuit includes a first turn-on control sub-circuit and a second turn-on control sub-circuit. The first turn-on control sub-circuit is coupled to the first clock signal terminal, the second clock signal terminal, the first voltage terminal, and a second denoising control node, and is configured to output the voltage of the first voltage terminal to the second denoising control node periodically in response to the signal of the first clock signal terminal, and to adjust a voltage of the second denoising control node periodically according to the signal of the second clock signal terminal, so that the second denoising control node provides the alternating voltage signal. The second turn-on control sub-circuit being coupled to the first denoising control node and the second denoising control node, and being configured to, in response to the alternating voltage signal provided by the second denoising control node, rectify the alternating voltage signal, and then output the signal to the first denoising control node.

In some embodiments, the first turn-on control sub-circuit includes a first transistor and a first capacitor; and/or, the second turn-on control sub-circuit includes a second transistor and a second capacitor. A control electrode of the first transistor is coupled to the first clock signal terminal, a first electrode of the first transistor is coupled to the first voltage terminal, and a second electrode of the first transistor is coupled to the second denoising control node. A first terminal of the first capacitor is coupled to the second clock signal terminal, and a second terminal of the first capacitor is coupled to the second denoising control node. A control electrode of the second transistor is coupled to the second denoising control node, a first electrode of the second transistor is coupled to the first denoising control node, and a second electrode of the second transistor is coupled to the second denoising control node. A first terminal of the second capacitor is coupled to a first signal terminal, and a second terminal of the second capacitor is coupled to the first denoising control node.

In some embodiments, the denoising control sub-circuit is further coupled to a cascade signal output terminal and a second signal terminal, and is further configured to control the denoising sub-circuit to be turned off according to a signal of the second signal terminal in response to a voltage of the cascade signal output terminal.

In some embodiments, the denoising control sub-circuit includes a first turn-on control sub-circuit, a second turn-on control sub-circuit, and a turn-off control unit. The first turn-on control sub-circuit is coupled to the first clock signal terminal, the second clock signal terminal, the first voltage terminal, and a second denoising control node, and is configured to output the voltage of the first voltage terminal to the second denoising control node periodically in response to the signal of the first clock signal terminal, and to adjust a voltage of the second denoising control node periodically according to the signal of the second clock signal terminal, so that the second denoising control node provides the alternating voltage signal. The second turn-on control sub-circuit is coupled to the first denoising control node and the second denoising control node, and is configured to, in response to the alternating voltage signal provided by the second denoising control node, rectify the alternating voltage signal, and then output the signal to the first denoising control node. The turn-off control unit is coupled to a cascade signal output terminal and a second signal terminal. The turn-off control unit includes a third transistor and a fourth transistor. A control electrode of the third transistor is coupled to the cascade signal output terminal, a first electrode of the third transistor is coupled to the second signal terminal, and a second electrode of the third transistor is coupled to the second denoising control node. A control electrode of the fourth transistor is coupled to the cascade signal output terminal, a first electrode of the fourth transistor is coupled to the second signal terminal, and a second electrode of the fourth transistor is coupled to the first denoising control node.

In some embodiments, the first turn-on control sub-circuit further includes a fifth transistor. The first terminal of the first capacitor is coupled to the second clock signal terminal through the fifth transistor. A control electrode of the fifth transistor is coupled to the scan signal output terminal, a first electrode of the fifth transistor is coupled to the second clock signal terminal, and a second electrode of the fifth transistor is coupled to the first terminal of the first capacitor.

In some embodiments, the first signal terminal is coupled to the first voltage terminal or the first clock signal terminal.

In some embodiments, the denoising sub-circuit includes a sixth transistor. A control electrode of the sixth transistor is coupled to the first denoising control node, a first electrode of the sixth transistor is coupled to the first voltage terminal, and a second electrode of the sixth transistor is coupled to the scan signal output terminal.

In some embodiments, the shift register circuit further includes an input sub-circuit. The input sub-circuit is coupled to the cascade signal output terminal, and is configured to control the voltage of the cascade signal output terminal, so as to enable the denoising sub-circuit to be turned on or turned off by the denoising control sub-circuit.

In some embodiments, the input sub-circuit includes a seventh transistor, an eighth transistor, a ninth transistor, a tenth transistor, a third capacitor, an eleventh transistor, a fourth capacitor, a twelfth transistor, a thirteenth transistor and a fourteenth transistor. A control electrode of the seventh transistor is coupled to a third clock signal terminal, a first electrode of the seventh transistor is coupled to a signal input terminal, and a second electrode of the seventh transistor is coupled to a first node.

A control electrode of the eighth transistor is coupled to the first node, a first electrode of the eighth transistor is coupled to the third clock signal terminal, and a second electrode of the eighth transistor is coupled to a second node.

A control electrode of the ninth transistor is coupled to the third clock signal terminal, a first electrode of the ninth transistor is coupled to the first voltage terminal, and a second electrode of the ninth transistor is coupled to the second node.

A control electrode of the tenth transistor is coupled to the second node, a first electrode of the tenth transistor is coupled to a second voltage terminal, and a second electrode of the tenth transistor is coupled to the cascade signal output terminal.

A first terminal of the third capacitor is coupled to the second node, and a second terminal of the third capacitor is coupled to the first electrode of the tenth transistor and the second voltage terminal.

A control electrode of the eleventh transistor is coupled to a third node, a first electrode of the eleventh transistor is coupled to a fourth clock signal terminal, and a second electrode of the eleventh transistor is coupled to the cascade signal output terminal.

A first terminal of the fourth capacitor is coupled to the third node, and a second terminal of the fourth capacitor is coupled to the second electrode of the eleventh transistor and the cascade signal output terminal.

A control electrode of the twelfth transistor is coupled to the first voltage terminal, a second electrode of the twelfth transistor is coupled to the third node, and a first electrode of the twelfth transistor is coupled to the first node.

A control electrode of the thirteenth transistor is coupled to the fourth clock signal terminal, a first electrode of the thirteenth transistor is coupled to the first node, and a second electrode of the thirteenth transistor is coupled to a fourth node.

A control electrode of the fourteenth transistor is coupled to the second node, a first electrode of the fourteenth transistor is coupled to the second voltage terminal, and a second electrode of the fourteenth transistor is coupled to the fourth node.

In some embodiments, the shift register circuit further includes an output sub-circuit. The output sub-circuit is coupled to a second voltage terminal or a fifth clock signal terminal, and is further coupled to the scan signal output terminal, and is configured to transmit a signal of the second voltage terminal or the fifth clock signal terminal to the scan signal output terminal in response to the turn-on signal transmitted by the input sub-circuit. Alternatively, The output sub-circuit is coupled to a second voltage terminal or a fifth clock signal terminal, and is further coupled to the scan signal output terminal, and is configured to transmit a signal of the second voltage terminal or the fifth clock signal terminal to the scan signal output terminal in response to the turn-on signal transmitted by the input sub-circuit. The output sub-circuit includes a fifteenth transistor. A control electrode of the fifteenth transistor is coupled to the cascade signal output terminal or the third node, a first electrode of the fifteenth transistor is coupled to the second voltage terminal or the fifth clock signal terminal, and a second electrode of the fifteenth transistor is coupled to the scan signal output terminal.

In some embodiments, the second signal terminal is coupled to a second voltage terminal, or the second signal terminal is coupled to a second node.

In some embodiments, the third clock signal terminal is coupled to the first clock signal terminal, and the fourth clock signal terminal is coupled to the second clock signal terminal.

In a second aspect, a gate driving circuit is provided. The gate driving circuit includes a plurality of cascaded shift register circuits. The shift register circuits are shift register circuits each according to any one of the above embodiments.

In a third aspect, a display apparatus is provided. The display apparatus includes a plurality of gate lines and the gate driving circuit according to the second aspect. Each shift register circuit in the gate driving circuit is coupled to at least one gate line.

In some embodiments, the scan signal output terminal of each shift register circuit in the gate driving circuit is coupled to at least one gate line.

In some embodiments, the plurality of gate lines include a plurality of first gate lines and a plurality of second gate lines; the scan signal output terminal of each shift register circuit in the gate driving circuit is coupled to at least one first gate line, and a cascade signal output terminal of each shift register circuit in the gate driving circuit is coupled to at least one second gate line.

In a fourth aspect, a method for driving the shift register circuit according to any one of the above embodiments is provided. The driving method includes: in a holding phase, generating, by the denoising control sub-circuit of the shift register circuit, the alternating voltage signal according to the voltage of the first voltage terminal and the signal of the second clock signal terminal in response to the signal of the first clock signal terminal, rectifying, by the denoising control sub-circuit, the alternating voltage signal, and outputting, by the denoising control sub-circuit, the signal to the first denoising control node, so that the voltage of the first denoising control node is maintained to be the voltage that enables the denoising sub-circuit to be turned on; and denoising, by the denoising sub-circuit, the scan signal output terminal in response to a voltage of the first denoising control node being the voltage that enables the denoising sub-circuit to be turned on.

In some embodiments, the shift register circuit further includes an input sub-circuit, and the input sub-circuit and the denoising control sub-circuit are coupled to a cascade signal output terminal. The driving method further includes: in an input phase, controlling, by the input sub-circuit, a voltage of the cascade signal output terminal to be a first control voltage in response to a signal of a third clock signal terminal coupled to the input sub-circuit, so as to enable the denoising sub-circuit to be turned on by the denoising control sub-circuit; and in an output phase, controlling, by the input sub-circuit, the voltage of the cascade signal output terminal to be a second control voltage, so as to enable the denoising sub-circuit to be turned off by the denoising control sub-circuit.

In a fifth aspect, a shift register circuit is provided. The shift register circuit includes a first transistor, a first capacitor, a second transistor, a second capacitor, and a sixth transistor. A control electrode of the first transistor being coupled to a first clock signal terminal, a first electrode of the first transistor being coupled to a first voltage terminal, and a second electrode of the first transistor being coupled to a second denoising control node. A first terminal of the first capacitor being coupled to a second clock signal terminal, and a second terminal of the first capacitor being coupled to the second denoising control node. A control electrode of the second transistor being coupled to the second denoising control node, a first electrode of the second transistor being coupled to a first denoising control node, and a second electrode of the second transistor being coupled to the second denoising control node. A first terminal of the second capacitor being coupled to a first signal terminal, and a second terminal of the second capacitor being coupled to the first denoising control node. A control electrode of the sixth transistor being coupled to the first denoising control node, a first electrode of the sixth transistor being coupled to the first voltage terminal, and a second electrode of the sixth transistor being coupled to a scan signal output terminal.

In some embodiments, the shift register circuit further includes a third transistor and a fourth transistor. A control electrode of the third transistor being coupled to a cascade signal output terminal, a first electrode of the third transistor being coupled to a second signal terminal, and a second electrode of the third transistor being coupled to the second denoising control node. A control electrode of the fourth transistor being coupled to the cascade signal output terminal, a first electrode of the fourth transistor being coupled to the second signal terminal, and a second electrode of the fourth transistor being coupled to the first denoising control node.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1A:
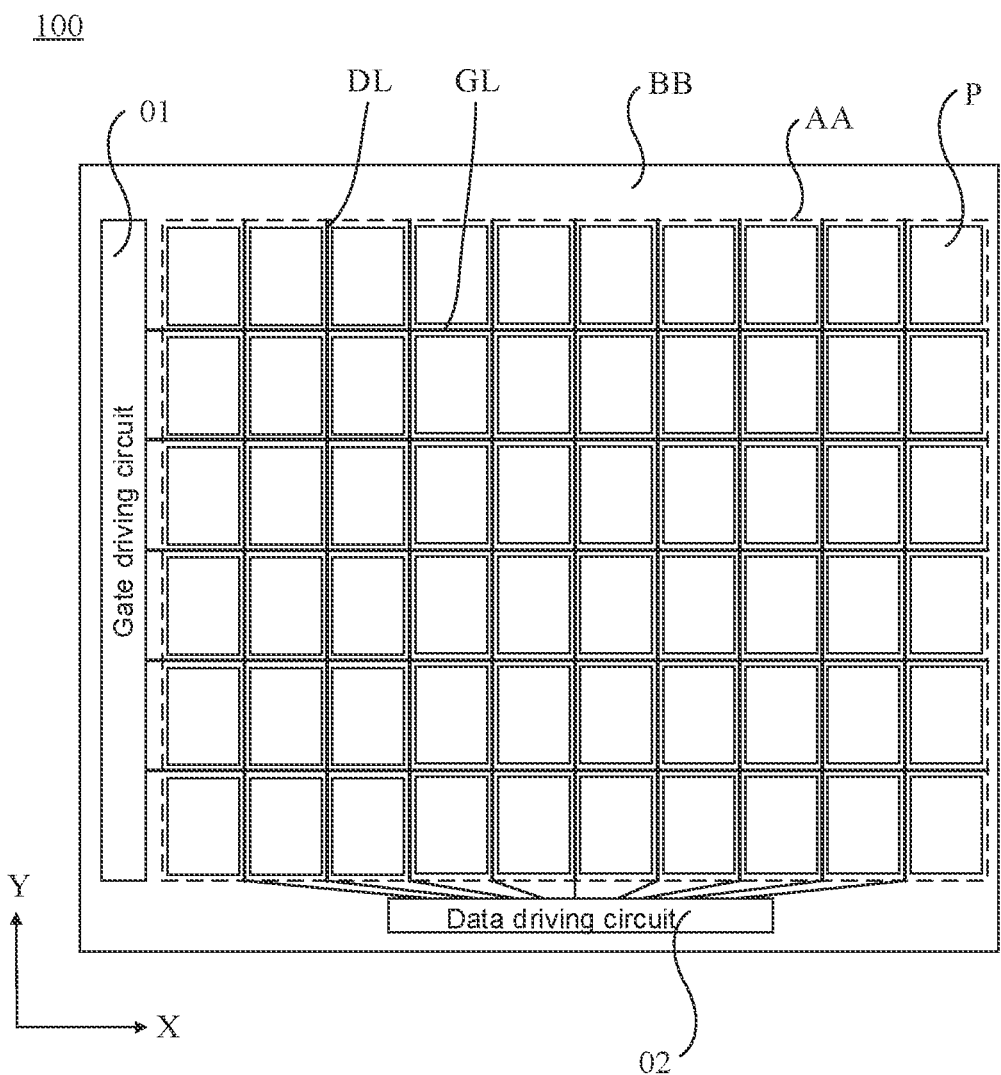
FIG. 1A is a diagram showing a structure of a display panel, in accordance with embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if", depending on the context, is optionally construed as "when" or "in a case where" or "in response to determining" or "in response to detecting". Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phase "applicable to" or "configured to" herein means an open and inclusive language, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary accompanying drawings. In the accompanying drawings, thicknesses of layers and regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus. The display apparatus refers to a product with an image display function. For example, the display apparatus may be a television, a mobile phone, a computer, a notebook computer, a tablet computer, a personal digital assistant (PDA), a vehicle-mounted computer, a display, a billboard, a digital photo frame, a laser printer with a display function, a telephone, a digital camera, a portable camcorder, a viewfinder, a monitor, a navigator, a vehicle, a large-area wall, a household appliance, or an information inquiry device (e.g., a business inquiry device or a monitor of a department such as an electronic government department, a bank, a hospital or an electric power department). The display apparatus includes a frame, and a display panel, a circuit board, a display driver integrated circuit (IC) and other electronic accessories, which are disposed in the frame.

The display panel may be a liquid crystal display (LCD) panel, an organic light-emitting diode (OLED) display panel, a quantum dot light-emitting diode (QLED) display panel, a micro light-emitting diode (including mini LED or micro LED) display panel, or the like, which is not specifically limited in the present disclosure.

Following embodiments of the present disclosure will be described by taking an example in which the display panel is the OLED display panel.

As shown in FIG. 1A, the display panel 100 has display area AA and a peripheral area BB located on at least one side of the display area AA. FIG. 1A shows an example in which the peripheral area BB surrounds the display area AA.

The display panel 100 includes sub-pixels P of a plurality of colors arranged in the display area AA. The sub-pixels of the plurality of colors include at least sub-pixels of a first color, sub-pixels of a second color, and sub-pixels of a third color. The first color, the second color and the third color are three primary colors (e.g., red, green and blue).

For convenience of description, the embodiments of the present disclosure are described by taking an example in which the plurality of sub-pixels P are arranged in a matrix. In this case, sub-pixels P arranged in a line in a horizontal direction X are referred to as sub-pixels in a same row, and sub-pixels P arranged in a line in a vertical direction Y are referred to as sub-pixels in a same column.

Figure 1B:
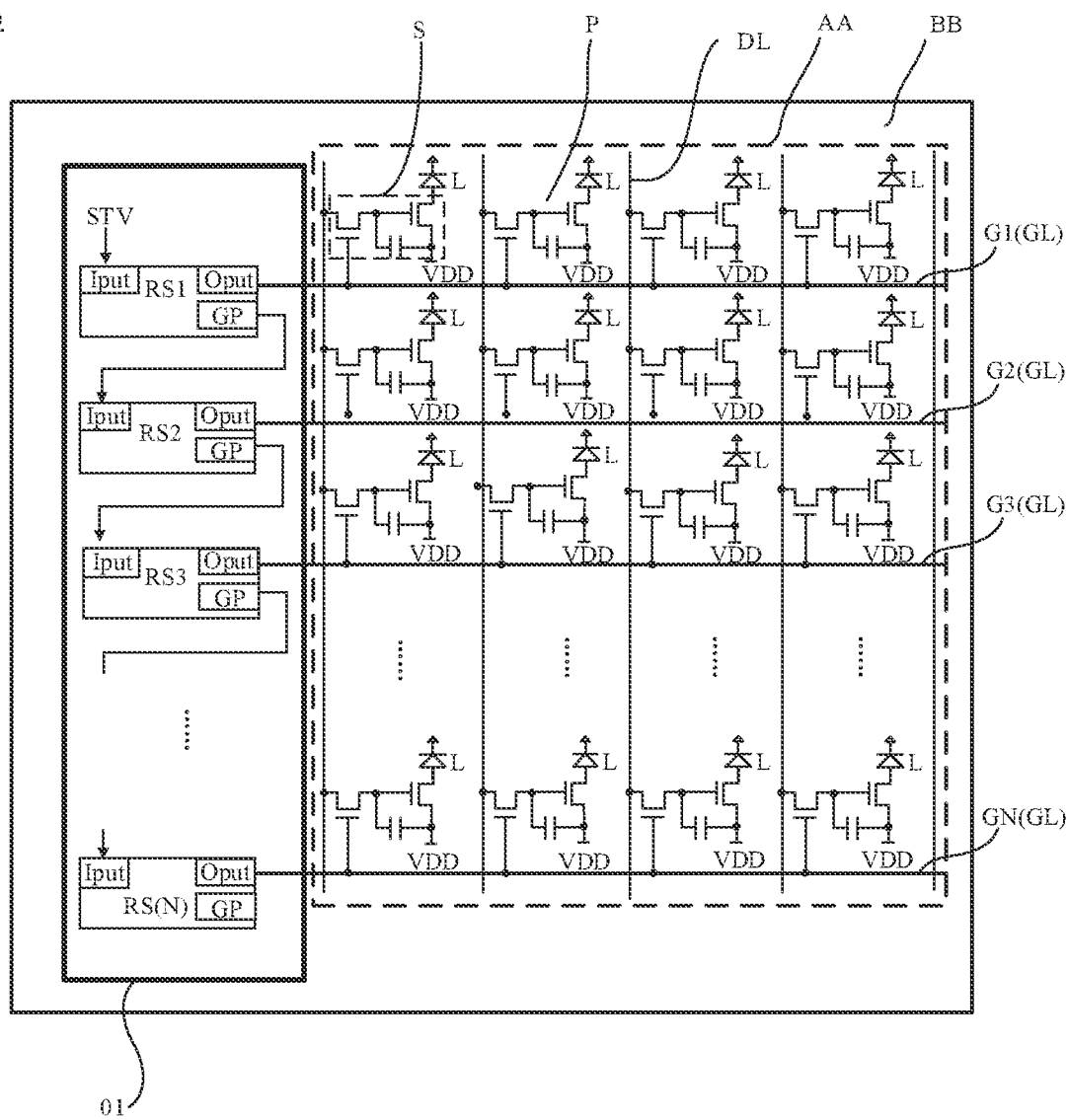
FIG. 1B is a diagram showing a gate driving architecture of a display panel, in accordance with embodiments of the present disclosure.

As shown in FIG. 1B, each sub-pixel P is provided with a pixel circuit S (also referred to as a pixel driving circuit) therein, and the pixel circuit S includes a plurality of transistors (FIG. 1B showing an example in which the pixel circuit S includes two transistors). The pixel circuit is coupled to a light-emitting device L, and is used to drive the light-emitting device L to emit light. Pixel circuits S in a same row are connected (i.e., coupled) to a same gate line GL, and pixel circuits S in a same column are connected to a same data line DL. In addition, the arrangement of the plurality of sub-pixels P depends on an arrangement of pixel circuits S in the plurality of sub-pixels P, and has nothing to do with positions of light-emitting devices L in the sub-pixels P.

The transistors included in the pixel circuit S may all be N-type transistors or P-type transistors, or may include both an N-type transistor and a P-type transistor, which may be designed according to actual needs.

In addition, the pixel circuit S may include at least one of a low temperature poly-silicon (LTPS) transistor and an oxide transistor. For example, the transistors in the pixel circuit S may all be LTPS transistors or oxide transistors, or may include both an LTPS transistor and an oxide transistor.

In some embodiments, a voltage for controlling brightness of the sub-pixel will change with time due to current leakage of the transistors in the pixel circuit S. Therefore, in order to keep fluctuation of the brightness of the sub-pixel within a reasonable range, data still needs to be refreshed when a static image is displayed. In order to reduce power consumption when the static image is displayed, reducing a refresh frequency is an effective method. While the refresh frequency is reduced, a display quality also needs to be maintained, thus, it requires reducing a speed of the current leakage of the transistors in the pixel circuit S. Since oxide semiconductors have a characteristic of ultra-low current leakage, the transistors in the pixel circuit S may be provided as oxide transistors, so that the current leakage of the transistors in the pixel circuit S may be reduced during display an image by the display panel. Since a carrier mobility of LTPS transistors is high, it may be possible to greatly improve a response speed of the transistors by using the LIPS transistors in the pixel circuit S, thereby ensuring a charging speed of the sub-pixel. Moreover, for the LIPS transistors, sources and drains are formed by self-alignment through ion implantation. Therefore, parasitic capacitances generated between gates and both the sources and the drains are much smaller than those of amorphous silicon transistors, thereby greatly reducing capacitive coupling effect. In order to reduce the current leakage of the transistors in the pixel circuit, and to ensure the charging speed and the small parasitic capacitances of the sub-pixel, a low temperature polycrystalline oxide (LTPO) process may be used in combination with advantages of the LTPS transistors and Oxide transistors. For example, the pixel circuit S includes two types of transistors, i.e., the LTPS transistor and the oxide transistor. For example, the pixel circuit S includes a P-type LIPS transistor and an N-type oxide transistor.

Referring to FIGS. 1A and 1B, the display apparatus further include a gate driving circuit 01 and a data driving circuit 02. For example, the gate driving circuit 01 may be disposed in the peripheral area BB of the display panel 100; for example, the gate driving circuit 01 may be disposed on a side of the peripheral area BB located at ends of gate lines GL (e.g., a left side of the peripheral area BB in FIG. 1A). For example, the data driving circuit 02 may be disposed in the peripheral area BB of the display panel 100; for example, the data driving circuit 02 may be disposed on a side of the peripheral area BB located at ends of data lines DL (e.g., a lower side of the peripheral area BB in FIG. 1A). Based on this, it is possible to drive the pixel circuits S in the display panel 100, and then to drive the light-emitting devices L to emit light, so that corresponding sub-pixels P present colors to be displayed.

In some embodiments, the gate driving circuit 01 may be a gate driving IC, which is bonded to an array substrate (also referred to as a driving backplane) in the display panel 100. In some other embodiments, the gate driving circuit 01 may be a gate driver on array (GOA) circuit, which is included in the display panel 100, and in this case, the gate driving circuit 01 is directly integrated into the array substrate in the display panel 100. Compared with bonding the gate driving circuit 01 to the array substrate in the form of the gate driving IC, by providing the gate driving circuit 01 in the array substrate, a manufacturing cost of the display panel may be reduced, and a width of a bezel of the display apparatus may be reduced. The following embodiments are all described by taking an example in which the gate driving circuit 01 is the GOA circuit.

It will be noted that, FIGS. 1A and 1B only show examples in which the gate driving circuit 01 is disposed on a single side of the peripheral area BB of the display panel 100, and the gate lines GL are driven row by row from the single side, i.e., a single-sided driving manner. In some other embodiments, gate driving circuits may be disposed on both sides of the peripheral area BB of the display panel 100 in an extension direction of the gate lines GL, and the gate lines GL are driven row by row from both sides simultaneously through the two gate driving circuits, i.e., a double-sided driving manner. In yet some other embodiments, the gate driving circuits may be disposed on both sides of the peripheral area BB of the display panel 100 in the extension direction of the gate lines GL, and the gate lines GL are driven row by row from both sides alternately through the two gate driving circuits. For example, one gate driving circuit drives gate lines GL in odd-numbered rows, and the other gate driving circuit drives gate lines GL in even-numbered rows, i.e., an alternate driving manner. The following embodiments of the present disclosure are all described by taking the single-sided driving manner as an example.

In some embodiments of the present disclosure, as shown in FIG. 1B, the gate driving circuit 01 includes N stages of cascaded shift register circuits (RS1, RS2, . . . , and RS(N)), and the N stages of cascaded shift register circuits (RS1, RS2, . . . , and RS(N)) are respectively connected to N gate lines (G1, G2, . . . , and G(N)) in one-to-one correspondence, and N is a positive integer.

For example, circuit structures of the respective stages of shift register circuits (RS1, RS2, . . . , and RS(N)) may be same, and the respective stages of shift register circuits (RS1, RS2, . . . , and RS(N)) are connected in sequence, so that the respective stages of shift register circuits sequentially output turn-on voltages (also referred to as active levels in scan signals, such as high levels), thereby achieving row-by-row scanning of the plurality of gate lines in the display panel, and charging the sub-pixels in respective rows coupled to the gate lines.

For example, as shown in FIG. 1B, a stage of shift register circuit of the gate driving circuit 01 is denoted as RS(i), and i is equal to 1, 2, . . . , or N. The shift register circuit RS(i) includes a scan signal output terminal Output (abbreviated as Oput hereinafter and in the accompanying drawings), and the scan signal output terminal Oput outputs a gate scan signal to a gate line GL connected thereto.

Each stage of shift register circuit RS(i) of the gate driving circuit 01 is further provided with a signal input terminal Input (abbreviated as Iput in the accompanying drawings and hereinafter), so as to provide a start signal to the stage of shift register circuit RS(i).

In addition, each stage of shift register circuit RS(i) of the gate driving circuit 01 further includes a cascade signal output terminal GP, which may be connected to a shift register circuit in a next stage, so as to transmit a cascade signal to the shift register circuit in the next stage as a start signal of the shift register circuit in the next stage.

Based on this, a cascade structure of the respective stages of shift register circuits RS(i) in the gate driving circuit 01 may be as follows.

A signal input terminal Iput of a first-stage shift register circuit RS1 is connected to a start signal terminal STV; except the first-stage shift register circuit RS1, a signal input terminal Iput of a shift register circuit RS(i) in any other stage is connected to a cascade signal output terminal GP of a shift register circuit RS(i−1) in a previous stage.

Based on the cascade structure, the scan signal output terminal Oput of the shift register circuit RS(i) in each stage is coupled to at least one gate line GL.

In some embodiments, in a case where the pixel circuit S includes both the P-type LIPS transistor and the N-type oxide transistor, the cascade signal output terminal GP may further be connected to P-type transistors in the pixel circuits S through a gate line, so as to transmit a signal (which may be referred to as a control signal) to the P-type transistors to control the P-type transistors to be turned on or turned off.

Based on this, a connection relationship between the respective stages of shift register circuits (RS1, RS2, . . . , and RS(N)) in the gate driving circuit 01 and the plurality gate lines GL may be as follows.

Pixel circuits in a same row may be coupled to at least two gate lines, and the at least two gate lines include at least one first gate line and at least one second gate line. The scan signal output terminal Oput of each shift register circuit in the gate driving circuit is coupled to at least one first gate line, and the cascade signal output terminal GP of each shift register circuit in the gate driving circuit is coupled to at least one second gate line. Since the gate line connected to the scan signal output terminal Oput and the gate line connected to the cascade signal output terminal GP are not a same gate line, for convenience of distinction, the gate line coupled to the scan signal output terminal Oput is referred to as the first gate line, and the gate line coupled to the cascade signal output terminal GP is referred to as the second gate line.

Figure 2:
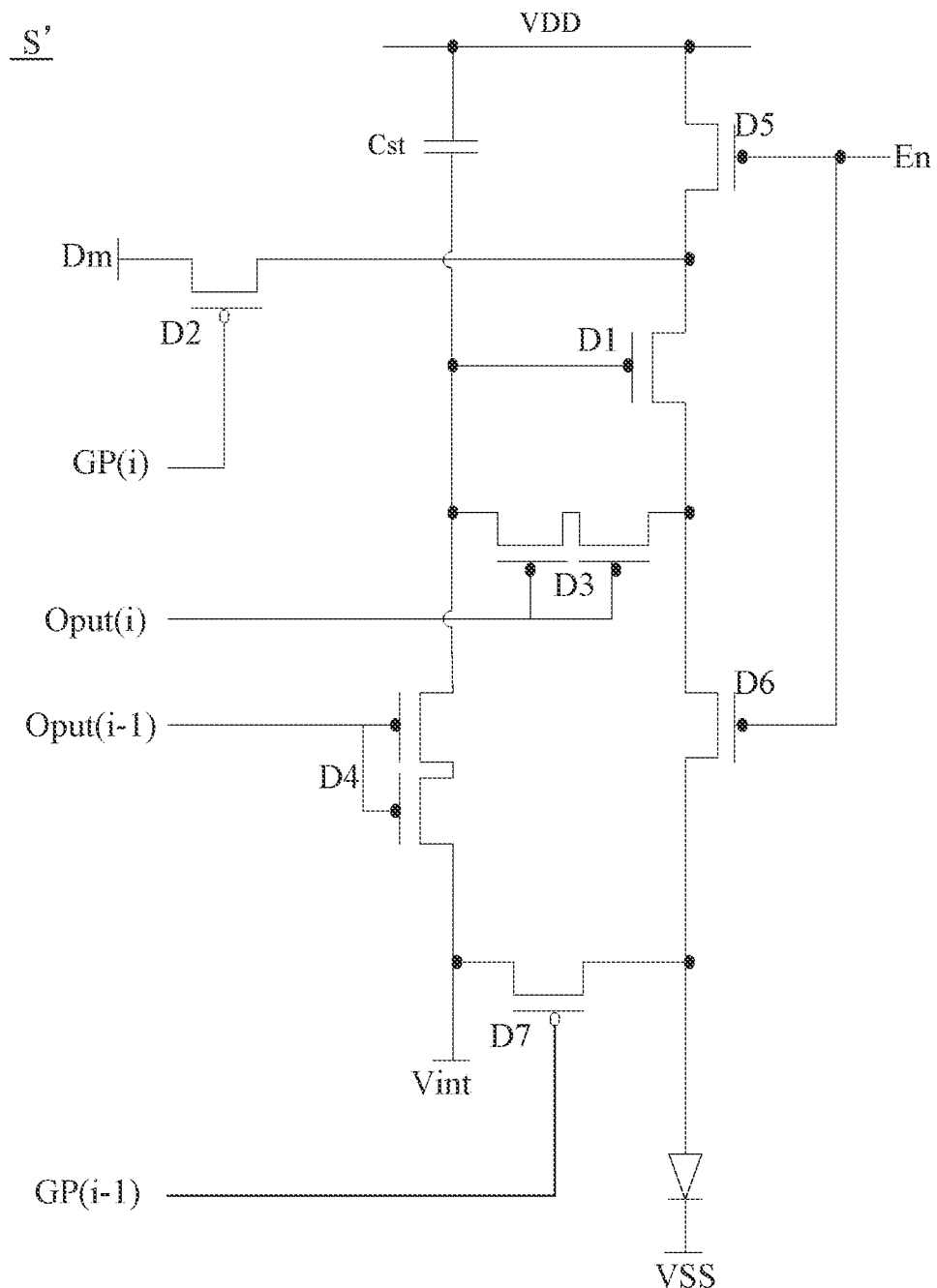
FIG. 2 is a diagram showing a structure of a pixel circuit in the related art.

With reference to a 7T1C pixel circuit shown in FIG. 2, a method for controlling a LTPO type pixel circuit will be described by taking the 7T1C pixel circuit as an example. As shown in FIG. 2, the pixel circuit S' includes seven transistors D1 to D7 and a capacitor Cst. The transistor D3 and D4 are N-type transistors, such as N-type oxide transistors, and the transistors D2 and D7 are P-type transistors, such as P-type LTPS transistors. In any pixel circuit S' in an i-th row, the transistors D3 and D4 may be respectively coupled to a scan signal output terminal Oput(i) of a shift register circuit in a current stage and a scan signal output terminal Oput(i−1) of a shift register circuit in a previous stage through two first gate lines, and the transistors D2 and D7 may be respectively coupled to a cascade signal output terminal GP(i) of the shift register circuit in the current stage and a cascade signal output terminal GP(i−1) of the shift register circuit in the previous stage through two second gate lines.

Through the first gate lines and the second gate lines, the shift register circuits may respectively control the oxide transistors and the LIPS transistors in the LTPO type pixel circuit, so that a response time of the control process is greatly shortened.

In some related art, in a driving process of a row of gate line(s) in a frame period, a stage of shift register circuit first outputs a turn-on voltage (also referred to as an active voltage or a working voltage) of a scan signal to the gate line coupled thereto, so that a row of sub-pixels coupled to the gate line are turned on, and this phase is referred to as an output phase; thereafter, the stage of shift register circuit outputs a turn-off voltage (also referred to as a non-working voltage) of the scan signal to the gate line coupled thereto, so as to ensure that the sub-pixels coupled to the gate line are turned off, that is, a holding phase is started. However, in the holding phase, noise of the scan signal output terminal of the shift register circuit coupled to the gate line is large, which may cause an image displayed by a display apparatus to be unstable.

One of reasons of the above problem is as follows.

Figure 3:
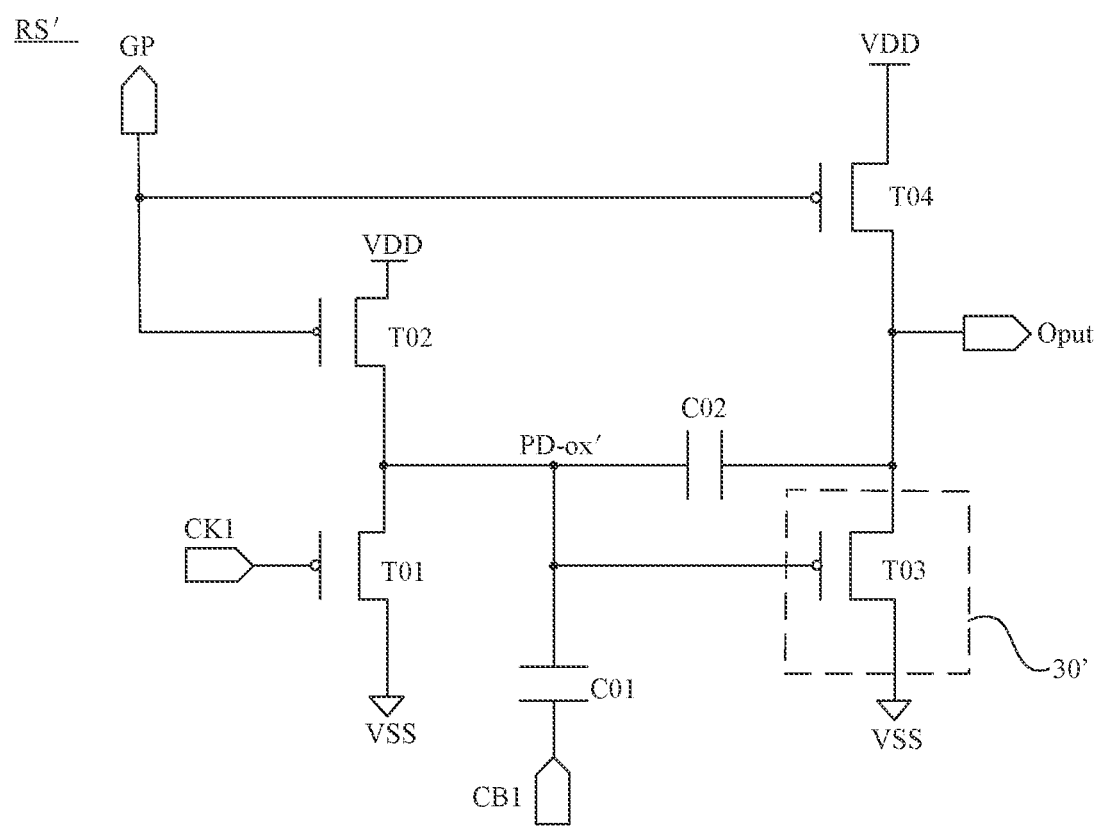
FIG. 3 is a diagram showing a partial structure of a shift register circuit in the related art.
Figure 4:
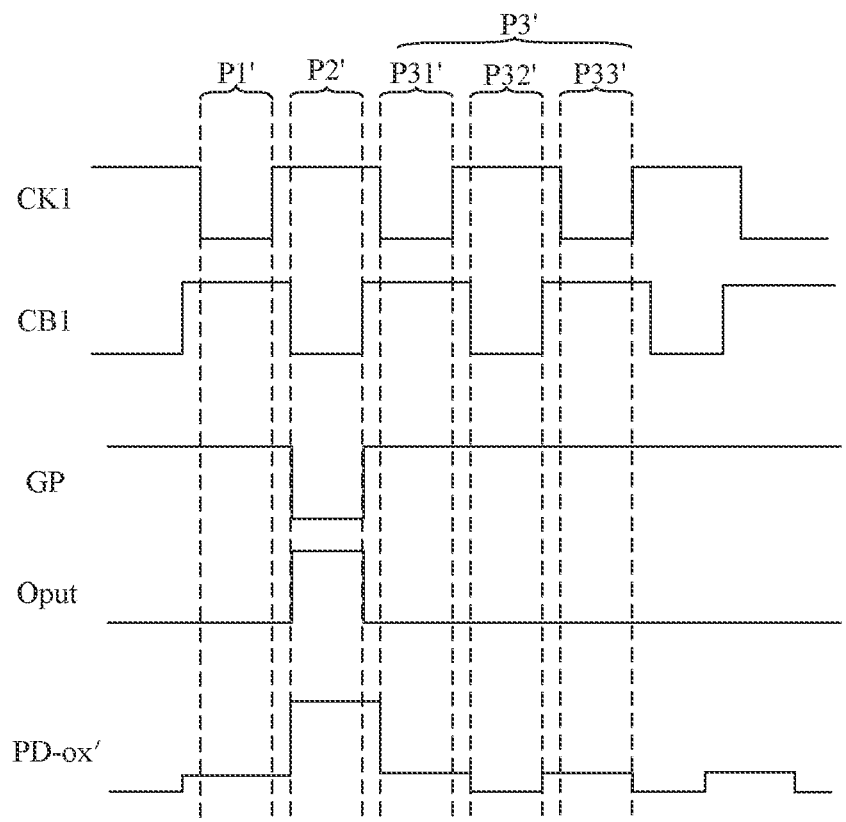
FIG. 4 is a diagram showing a partial driving timing of a shift register circuit in the related art.

As shown in FIGS. 3 and 4, FIG. 3 shows a partial circuit structure of a shift register circuit RS' in some related art, and FIG. 4 shows a partial driving timing of the shift register circuit RS'. In FIG. 3, the number 30' represents a denoising sub-circuit, and the denoising sub-circuit 30' includes a transistor T03.

In the driving process of a row of the gate line(s), in an output phase P2', a voltage at a cascade signal output terminal GP is a low voltage, a transistor T04 is turned on, and a scan signal output terminal Oput outputs a scan signal, which is in a high level. A transistor T02 is turned on, and a voltage at a node PD-ox' is a high voltage, so that a transistor T03 in the denoising sub-circuit 30' is turned off.

In a period P31' of the holding phase P3', a voltage at a clock signal terminal CK1 is a low voltage, a transistor T01 is turned on, and the voltage at the node PD-ox' is a low voltage ($V_{SS}$+|Vth|), in which Vth is a threshold voltage of the transistor T01, so that the transistor T03 in the denoising sub-circuit 30' is turned on, and a voltage at the scan signal output terminal Oput is changed to a low voltage ($V_{SS}$+|Vth|). As a result, the scan signal output terminal Oput is reset.

In a period P32' of the holding phase P3', the voltage at the clock signal terminal CK1 is a high voltage, and the transistor T01 is turned off; the voltage at the cascade signal output terminal GP is a high voltage, the transistor T02 is also turned off. Thus, the voltages at the node PD-ox' is in a floating state. A voltage at a clock signal terminal CB1 is changed to a low voltage, the voltage at the node PD-ox' is further pulled down due to a coupling effect of a capacitor C01, so that the transistor T03 in the denoising sub-circuit 30' is turned on, the voltage at the scan signal output terminal Oput is changed to a low voltage. As a result, the scan signal output terminal Oput is further reset.

In a period P33' of the holding phase P3', the voltage at the clock signal terminal CK1 is the low voltage, the voltage at the node PD-ox' is also a low voltage, and a threshold voltage Vth of a positive-channel metal oxide semiconductor (PMOS) transistor is generally negative, so that a difference Vgs between voltages of a gate and a source of the transistor T01 is larger than Vth. Since the PMOS transistor is turned on in a case where Vgs is smaller than Vth, the transistor T01 is turned off at this time. Moreover, since the voltage at the cascade signal output terminal GP is the high voltage, and the transistors T02 and T04 are also turned off, the voltages at the node PD-ox' and the scan signal output terminal Oput are in the floating state. The voltage at the clock signal terminal CB1 is a high voltage, and the voltage at the node PD-ox' is slightly pulled up due to the coupling effect of the capacitor C01, so that the transistor T03 in the denoising sub-circuit 30' is turned off. As a result, the scan signal output terminal Oput cannot be denoised.

Figure 5:
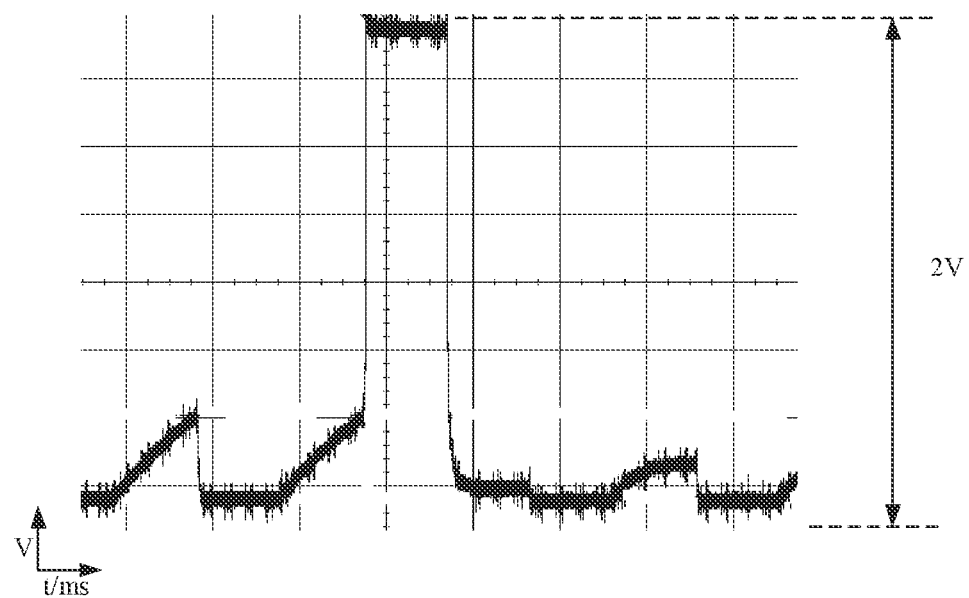
FIG. 5 is a diagram showing noise output by a shift register circuit in the related art.

It can be seen from the above that, since the clock signal terminals CK1 and CB1 are alternately in a high level and a low level, operation processes in the period P32' and the period P33' will be alternately performed thereafter. Therefore, in the holding phase, the denoising sub-circuit 30' cannot denoise the scan signal output terminal Oput for approximately half of time (i.e., the period P33' of the holding phase P3'), which causes that in a case of external interference, the shift register circuit RS' cannot be denoised in time in the holding phase P3', and the scan signal output terminal Oput may generate a signal with a large noise. As shown in FIG. 5, through a simulation test, the noise of the signal output by the scan signal output terminal Oput in the holding phase P3' may reach 2 V.

Figure 6:
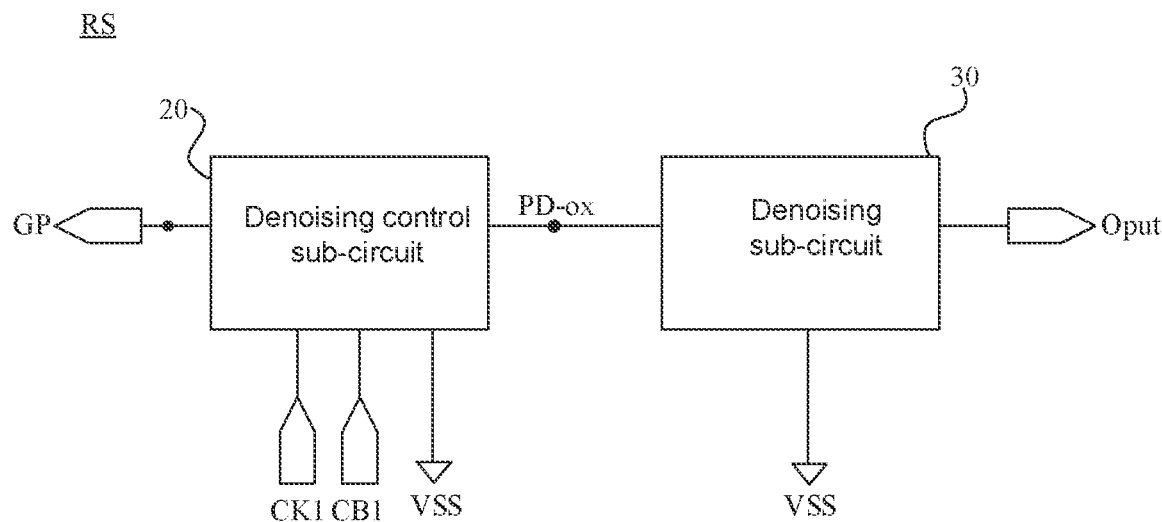
FIG. 6 is a diagram showing a structure of a shift register circuit, in accordance with embodiments of the present disclosure.

Some embodiments of the present disclosure provide a shift register circuit, so as to solve a problem that noise of the scan signal output terminal of the shift register circuit coupled to the gate line is large in a holding phase, which causes image display to be unstable. As show in FIG. 6, the shift register SR includes a denoising control sub-circuit 20 and a denoising sub-circuit 30.

The denoising control sub-circuit 20 is coupled to a first voltage terminal VSS, a first clock signal terminal CK1, a second clock signal terminal CB1 and a first denoising control node PD-ox. The denoising control sub-circuit 20 is configured to rectify electric charge of the first voltage terminal VSS and electric charge of the second clock signal terminal CB1 to the first denoising control node PD-ox under control of a signal of the first clock signal terminal CK1, so that a voltage at the first denoising control node PD-ox may be adjusted (pulled up or pulled down), and the voltage at the first denoising control node PD-ox is maintained to be a voltage that enables the denoising sub-circuit 30 to be turned on. For example, the denoising control sub-circuit 20 is configured to generate an alternating voltage signal (or an oscillation signal) according to a voltage of the first voltage terminal VSS and a signal of the second clock signal terminal CB1 in response to the signal of the first clock signal terminal CK1, and to rectify the alternating voltage signal, and then to output a signal to the first denoising control node PD-ox, so that a voltage of the first denoising control node PD-ox is maintained to be the voltage that enables the denoising sub-circuit 30 to be turned on. For example, the voltage of the first denoising control node PD-ox is gradually changed (gradually pulled up or pulled down), and finally, for example, to reach a stable state.

The alternating voltage signal refers to a signal whose voltage varies periodically in magnitude. For example, the alternating voltage signal may be a signal whose high voltage and low voltage change alternately, e.g., a square wave signal. A duration of the high voltage and a duration of the low voltage in a cycle may be same or different. In addition, an amplitude of the alternating voltage signal may remain unchanged. For example, high voltages in a plurality of cycles may be equal, and low voltages in the plurality of cycles may also be equal.

Rectification refers to outputting the alternating voltage signal as a direct current voltage signal. In the embodiments of the present disclosure, the direct current voltage signal is defined relative to the alternating voltage signal, and may be a signal whose voltage does not change with time; alternatively, the direct current voltage signal may include a signal whose amplitude (voltage) gradually increases or decreases with time, which may eventually, for example, reach a steady state (that is, the voltage no longer changes). For example, the direct current voltage signal may include a plurality of cycles, a magnitude of a voltage in each cycle is constant, and a magnitude of a voltage in any cycle is higher than a magnitude of a voltage in a previous cycle, or a magnitude of a voltage in any cycle is lower than a magnitude of a voltage of a previous cycle.

It will be understood that, "the voltage that enables the denoising sub-circuit 30 to be turned on" refers to a voltage that enables the denoising sub-circuit 30 to work, and the voltage specifically depends on a type of a transistor included in the denoising sub-circuit 30. For example, if the transistor included in the denoising sub-circuit 30 is a P-type transistor, the voltage is a low voltage; if the transistor included in the denoising sub-circuit 30 is an N-type transistor, the voltage is a high voltage. The denoising sub-circuit 30 is coupled to the first denoising control node PD-ox and the scan signal output terminal Oput. The denoising sub-circuit 30 is configured to denoise the scan signal output terminal Oput in response to the voltage of the first denoising control node being the voltage that enables the denoising sub-circuit to be turned on.

In the shift register circuit RS, the denoising control sub-circuit 20 may perform voltage-stabilizing adjustment on the voltage of the first denoising control node PD-ox according to a received signal (which may include, for example, a signal of the first voltage terminal VSS and the signal of the second clock signal terminal CB1) under the control of the signal of the first clock signal terminal CK1, that is, the voltage of the first denoising control node PD-ox is stabilized at the voltage (at a high level or a low level) that enables the denoising sub-circuit 30 to be turned on. The denoising control sub-circuit 20 outputs the adjusted voltage to the denoising sub-circuit 30, and controls the denoising sub-circuit 30 to be maintained in a turn-on state, so that the denoising sub-circuit 30 continuously outputs a stable non-working voltage, and the scan signal output terminal Oput is continuously denoised, thereby improving stability of a displayed image.

Figure 7:
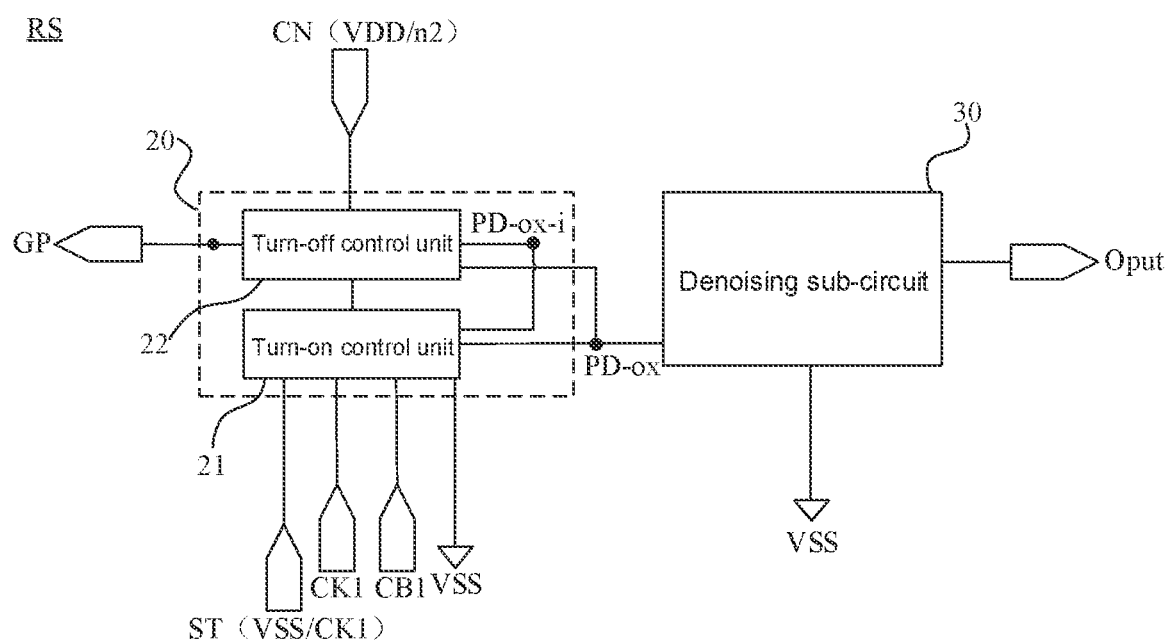
FIG. 7 is a diagram showing a structure of another shift register circuit, in accordance with embodiments of the present disclosure.

In some embodiments, as shown in FIG. 7, the denoising control sub-circuit 20 includes a turn-on control unit 21 and a turn-off control unit 22. The turn-on control unit 21 is coupled to the first voltage terminal VSS, the first clock signal terminal CK1, the second clock signal terminal CB1, and the first denoising control node PD-ox. The turn-on control unit 21 is configured to rectify the electric charge of the first voltage terminal VSS and electric charge of the second clock signal terminal CB1 to the first denoising control node PD-ox under the control of the signal of the first clock signal terminal CK1, so as to pull up or pull down the voltage of the first denoising control node PD-ox, so that the voltage of the first denoising control node PD-ox is maintained to be the voltage that enables the denoising sub-circuit 30 to be turned on.

For example, the turn-on control unit 21 is configured to generate the alternating voltage signal according to the voltage of the first voltage terminal VSS and the signal of the second clock signal terminal CB1 in response to the signal of the first clock signal terminal CK1, and to rectify the alternating voltage signal, and then to output the signal to the first denoising control node PD-ox, so that the voltage of the first denoising control node PD-ox is maintained to be the voltage that enables the denoising sub-circuit 30 to be turned on. For example, the turn-on control unit 21 may further be coupled to a second denoising control node PD-ox-i, and the alternating voltage signal is a signal of the second denoising control node PD-ox-i.

Herein, for example, the first voltage terminal VSS is configured to transmit a direct current low-level signal. For example, the first voltage signal terminal VSS is grounded. In some embodiments, as shown in FIG. 8, the turn-on control unit 21 of the denoising control sub-circuit 20 includes a first turn-on control sub-circuit 211 and a second turn-on control sub-circuit 212.

The first turn-on control sub-circuit 211 is coupled to the first clock signal terminal CK1, the second clock signal terminal CB1, the first voltage terminal VSS, and the second denoising control node PD-ox-i, and is configured to output the voltage of the first voltage terminal VSS to the second denoising control node PD-ox-i periodically in response to the signal of the first clock signal terminal CK1, and to adjust a voltage of the second denoising control node PD-ox-i periodically according to the signal of the second clock signal terminal CB1, so that the second denoising control node PD-ox-i provides the alternating voltage signal.

Figure 8:
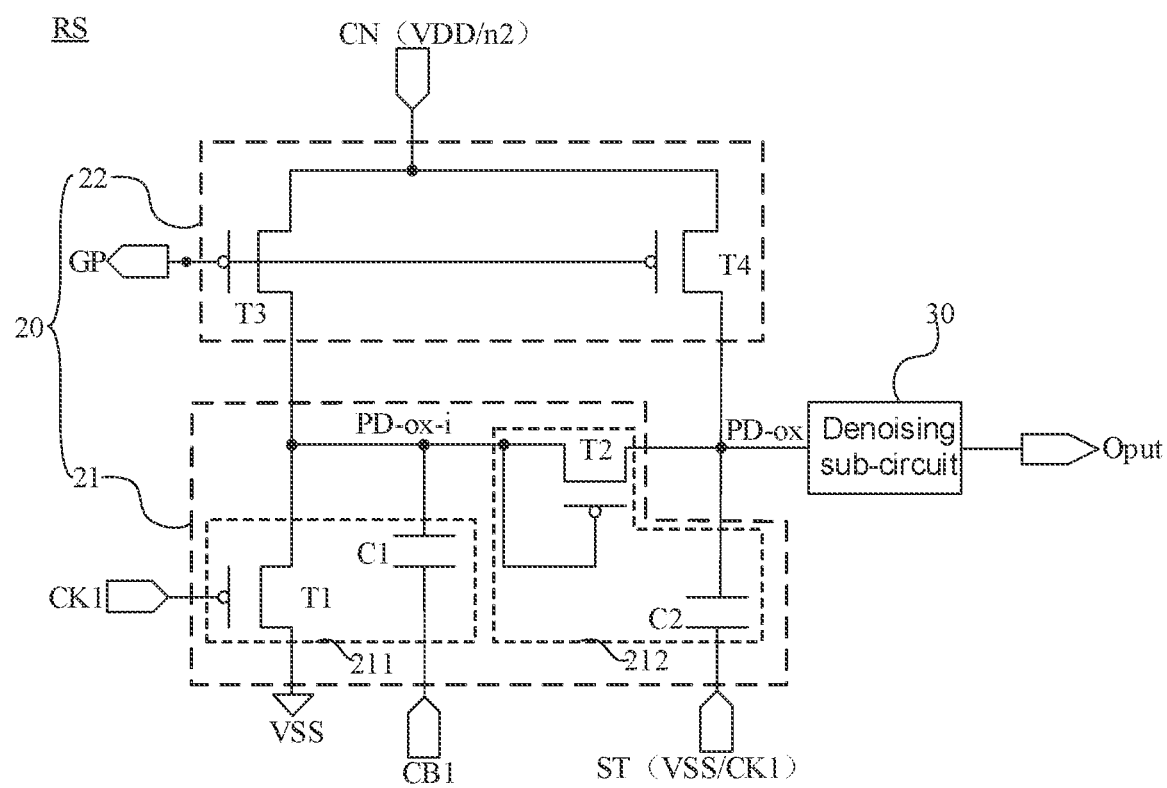
FIG. 8 is a diagram showing a structure of yet another shift register circuit, in accordance with embodiments of the present disclosure.

For example, as shown in FIG. 8, the first turn-on control sub-circuit 211 includes a first transistor T1 and a first capacitor C1.

A control electrode of the first transistor is coupled to the first clock signal terminal CK1, a first electrode of the first transistor is coupled to the first voltage terminal VSS, and a second electrode of the first transistor is coupled to the second denoising control node PD-ox-i.

A first terminal of the first capacitor C1 is coupled to the second clock signal terminal CB1, and a second terminal of the first capacitor C1 is coupled to the second denoising control node PD-ox-i.

For example, when the signal of the first clock signal terminal CK1 controls the first transistor T1 to be turned on, the voltage of the first voltage terminal VSS may be transmitted to the second denoising control node PD-ox-i through the first transistor T1; when the signal of the first clock signal terminal CK1 controls the first transistor T1 to be turned off, the voltage of the first voltage terminal VSS cannot be transmitted to the second denoising control node PD-ox-i; however, in response to the signal of the second clock signal terminal CB1, and a coupling effect of the first capacitor C1, the voltage of the second denoising control node PD-ox-i may be further adjusted. For example, when the signal of the first clock signal terminal CK1 controls the first transistor T1 to be turned on, the second clock signal terminal CB1 outputs a low level signal, and when the signal of the first clock signal terminal CK1 controls the first transistor T1 to be turned off, the second clock signal terminal CB1 outputs a high level signal to pull up the voltage of the second denoising control node PD-ox-i. Since the signal of the first clock signal terminal CK1 controls the first transistor T1 to be turned on and off periodically, the second clock signal terminal CB1 periodically adjusts the voltage of the second denoising control node PD-ox-i. Therefore, the first clock signal terminal CK1 and the second clock signal terminal CB1 work together to make the voltage of the second denoising control node PD-ox-i to be an alternating voltage.

The second turn-on control sub-circuit 212 is coupled to the first denoising control node PD-ox and the second denoising control node PD-ox-i, and rectifies the alternating voltage signal, and then outputs the signal to the first denoising control node, so that the voltage of the first denoising control node PD-ox is maintained to be the voltage that enables the denoising sub-circuit 30 to be turned on.

For example, referring to FIG. 8, the second turn-on control sub-circuit 212 includes a second transistor T2 and a second capacitor C2.

A control electrode of the second transistor T2 is coupled to the second denoising control node PD-ox-i, a first electrode of the second transistor T2 is coupled to the first denoising control node PD-ox, and a second electrode of the second transistor T2 is coupled to the second denoising control node PD-ox-i.

A first terminal of the second capacitor C2 is coupled to a first signal terminal ST, and a second terminal of the second capacitor C2 is coupled to the first denoising control node PD-ox.

For example, the second transistor T2 is periodically turned on by the alternating voltage signal provided by the second denoising control node PD-ox-i. When the first transistor T1 is turned on, the voltage of the first voltage terminal VSS is transmitted to the second denoising control node PD-ox-I, at this time, there is no coupling effect of the first capacitor C1, so that electric charge of the second terminal of the first capacitor C1 does not change. However, when the first transistor T1 is turned off, the voltage of the first voltage terminal VSS is not transmitted to the second denoising control node PD-ox-i, at this time, since coupling effect of the first capacitor C1, a voltage of the second terminal of the first capacitor C1 is pulled down by the second clock signal terminal CB1, and an amount of the electric charge of the second terminal of the first capacitor C1 is less than an amount of electric charge of the second terminal of the second capacitor C2, and thus the electric charge of the second terminal of the second capacitor C2 may be transmitted to the second terminal of the first capacitor C1 through the second transistor T2. Moreover, the above process cycles periodically, so that the electric charge of the second terminal of the second capacitor C2 is continuously transmitted to the second terminal of the first capacitor C1. As a result, the amount of the electric charge of the second terminal of the second capacitor C2 is gradually reduced, and is eventually stabilized at a fixed value. For example, the amount of the electric charge of the second terminal of the second capacitor C2 is stabilized to be equal to the amount of the electric charge of the second terminal of the first capacitor C1 when the voltage of the second terminal of the first capacitor C1 is pulled down by the second clock signal terminal CB1. Therefore, the voltage of the first denoising control node PD-ox coupled to the second capacitor C2 is stabilized at a fixed voltage that enables the denoising sub-circuit 30 to be continuously turned on.

It will be noted that, in the shift register circuit RS provided by the embodiments of the present disclosure, the first denoising control node PD-ox, the second denoising control node PD-ox-i and the cascade signal output terminal GP, as well as a first node n1, a second node n2, a third node n3 and a fourth node n4 that will be mentioned below do not represent real components, but rather represent junctions of related electrical connections in a circuit diagram. That is to say, these nodes are nodes equivalent to the junctions of the related electrical connections in the circuit diagram. It will be noted that, the first signal terminal (which may also be referred to as a voltage-stabilizing signal terminal) ST may be coupled to the first voltage terminal VSS or the first clock signal terminal CK1.

For example, in a case where the first signal terminal ST is coupled to the first voltage terminal VSS, the first terminal of the second capacitor C2 is coupled to the first voltage terminal VSS, so that the second capacitor C2 provides a voltage-stabilizing function for the first denoising control node PD-ox, and it may be possible to prevent current leakage of the first denoising control node PD-ox.

For example, in a case where the first signal terminal ST is coupled to the first clock signal terminal CK1, the first terminal of the second capacitor C2 is coupled to the first clock signal terminal CK1, so that the second capacitor C2 may not only stabilize the voltage of the first denoising control node PD-ox, but also further adjust the voltage of the first denoising control node PD-ox when a voltage of the signal of the first clock signal terminal CK1 changes. As a result, the voltage at the first denoising control node PD-ox may be quickly stabilized at the voltage that enables the denoising sub-circuit 30 to be turned on, and it may be possible to facilitate to increase a denoising speed of the denoising sub-circuit 30. For example, in a case where the voltage that enables the denoising sub-circuit 30 to be turned on is a low voltage, when the voltage of the signal of the first clock signal terminal CK1 decreases, the second capacitor C2 may further pull down the voltage at the first denoising control node PD-ox, and it may be possible to facilitate to increase the denoising speed of the denoising sub-circuit 30.

The first transistor T1, the first capacitor C1, the second transistor T2 and the second capacitor C2 that are included in the turn-on control unit 21 constitute a charge pump structure. By using a voltage adjustment effect of the charge pump structure, the voltage of the first denoising control node PD-ox is stabilized at the voltage that enables the denoising sub-circuit 30 to be turned on, so that it may be possible to ensure that the denoising sub-circuit 30 is continuously turned on in a holding phase in a driving process of a row of gate line(s), and in turn, the scan signal output terminal Oput is continuously denoised.

In some embodiments, the turn-off control unit 22 of the denoising control sub-circuit 30 is coupled to the cascade signal output terminal GP, a second signal terminal (which may also be referred to as a control signal terminal) CN, the first denoising control node PD-ox, and the second denoising control node PD-ox-i. The turn-off control unit 22 is configured to transmit a signal of the second signal terminal CN to the first denoising control node PD-ox in response to a voltage of the cascade signal output terminal GP, so as to control the denoising sub-circuit 30 to be turned off.

For example, referring to FIG. 8, the turn-off control unit 22 includes a third transistor T3 and a fourth transistor T4.

A control electrode of the third transistor T3 is coupled to the cascade signal output terminal GP, a first electrode of the third transistor T3 is coupled to the second signal terminal CN, and a second electrode of the third transistor T3 is coupled to the second denoising control node PD-ox-i.

A control electrode of the fourth transistor T4 is coupled to the cascade signal output terminal GP, a first electrode of the fourth transistor T4 is coupled to the second signal terminal CN, and a second electrode of the fourth transistor T4 is coupled to the first denoising control node PD-ox.

It will be noted that, the second signal terminal CN may be coupled to a second voltage terminal VDD or the second node n2. Here, for example, the second voltage terminal VDD is configured to transmit a direct current high level signal; for example, a voltage value of the direct current high level signal is greater than a voltage value of the direct current low level signal transmitted from the first voltage terminal VSS. Here, the second node n2 is a node in an input sub-circuit 10 that will be mentioned below. For example, a voltage of the node is at a high level in an output phase in the driving process of the row of the gate line(s), and is at a low level in the holding phase.

For example, in a case where the second signal terminal CN is coupled to the second voltage terminal VDD, in the output phase, the third transistor T3 and the fourth transistor T4 are turned on under control of the voltage of the cascade signal output terminal GP, and the voltages of the first denoising control node PD-ox and the second denoising control node PD-ox-i are each changed to a voltage of the second voltage terminal VDD, i.e., a high voltage, so that the denoising sub-circuit 30 is maintained to be turned off in the output phase, and output of the scan signal at the scan signal output terminal Oput is not affected. In the holding phase, the third transistor T3 and the fourth transistor T4 remain in a turn-off state under the control of the voltage of the cascade signal output terminal GP, so that a high voltage of the second signal terminal CN has substantially no effect on the voltages of the first denoising control node PD-ox and the second denoising control node PD-ox-i.

For example, in an example where the third transistor T3 and the fourth transistor T4 are both P-type transistors, in a case where the second signal terminal CN is coupled to the second node n2, since a voltage of the second node n2 is at a high level in the output phase, and is at a low level in the holding phase, in the output phase, the third transistor T3 and the fourth transistor T4 are turned on under the control of the voltage of the cascade signal output terminal GP, and the voltages of the first denoising control node PD-ox and the second denoising control node PD-ox-i are each changed to the voltage of the second node n2, i.e., a high voltage, so that the denoising sub-circuit 30 is maintained to be turned off in the output phase, and the output of the scan signal at the scan signal output terminal Oput is not affected. In the holding phase, the third transistor T3 and the fourth transistor T4 remain in the turn-off state under the control of the voltage of the cascade signal output terminal GP, and a voltage of the second signal terminal CN is at a low level, which facilitates to reduce the current leakage of the third transistor T3 and the fourth transistor T4, thereby reducing influence of the current leakage of the third transistor T3 and the fourth transistor T4 on the voltage of the first denoising control node PD-ox. As a result, a speed at which the voltage of the first denoising control node PD-ox is adjusted is made faster, and in turn, the voltage of the first denoising control node PD-ox may reach a stable voltage value in a shorter time, and the denoising speed of the denoising sub-circuit 30 is further increased.

Figure 9:
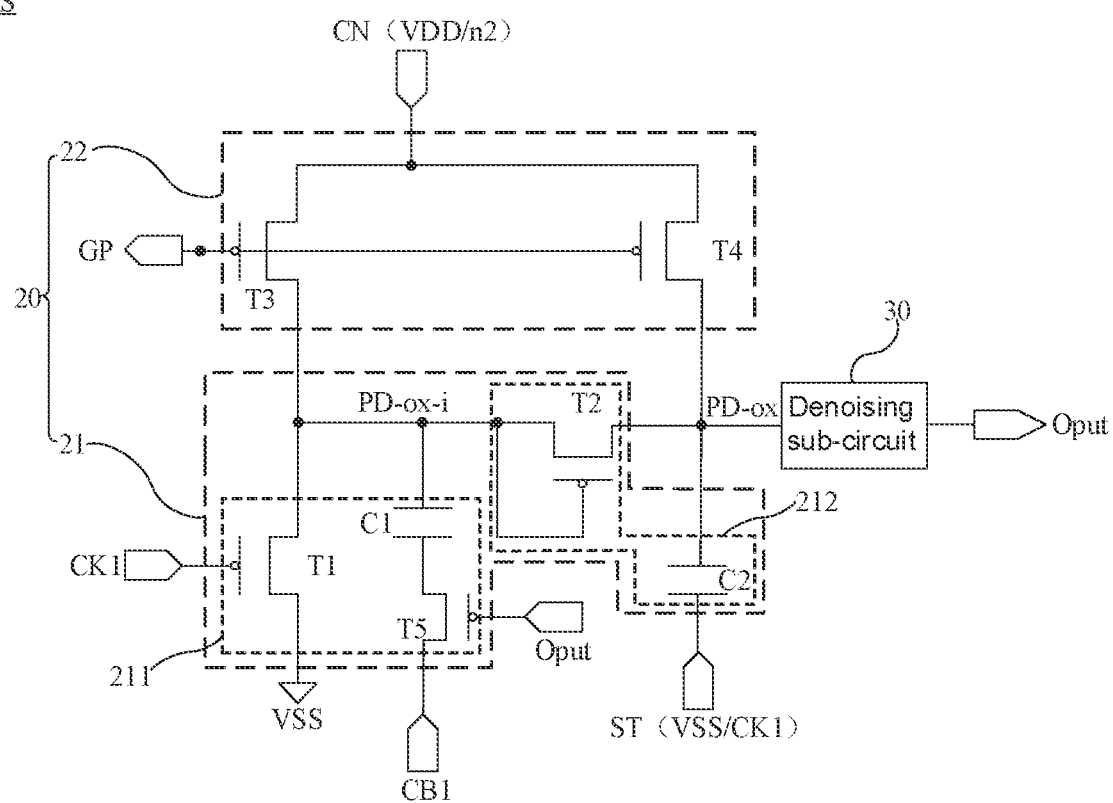
FIG. 9 is a diagram showing a structure of yet another shift register circuit, in accordance with embodiments of the present disclosure.

In some embodiments, as shown in FIG. 9, the first turn-on control sub-circuit 211 includes a fifth transistor T5. The first terminal of the first capacitor C1 is coupled to the second clock signal terminal CB1 through the fifth transistor T5. A control electrode of the fifth transistor T5 is coupled to the scan signal output terminal Oput, a first electrode of the fifth transistor T5 is coupled to the second clock signal terminal CB1, and a second electrode of the fifth transistor T5 is coupled to the first terminal of the first capacitor C1.

In an example where the fifth transistor T5 is a P-type transistor, since the control electrode of the fifth transistor T5 is coupled to the scan signal output terminal Oput, in the output phase, the fifth transistor T5 is turned off under control of a high-level signal output from the scan signal output terminal Oput, thereby disconnecting the second clock signal terminal CB1 to the first capacitor C1. As a result, a change in a voltage of the second clock signal terminal CB1 does not affect the first capacitor C1, and in turn, the coupling effect of the first capacitor C1 under the change in the potential of the second clock signal terminal CB1 is eliminated, and then influence on a potential at the second denoising control node PD-ox-i is eliminated.

Figure 11:
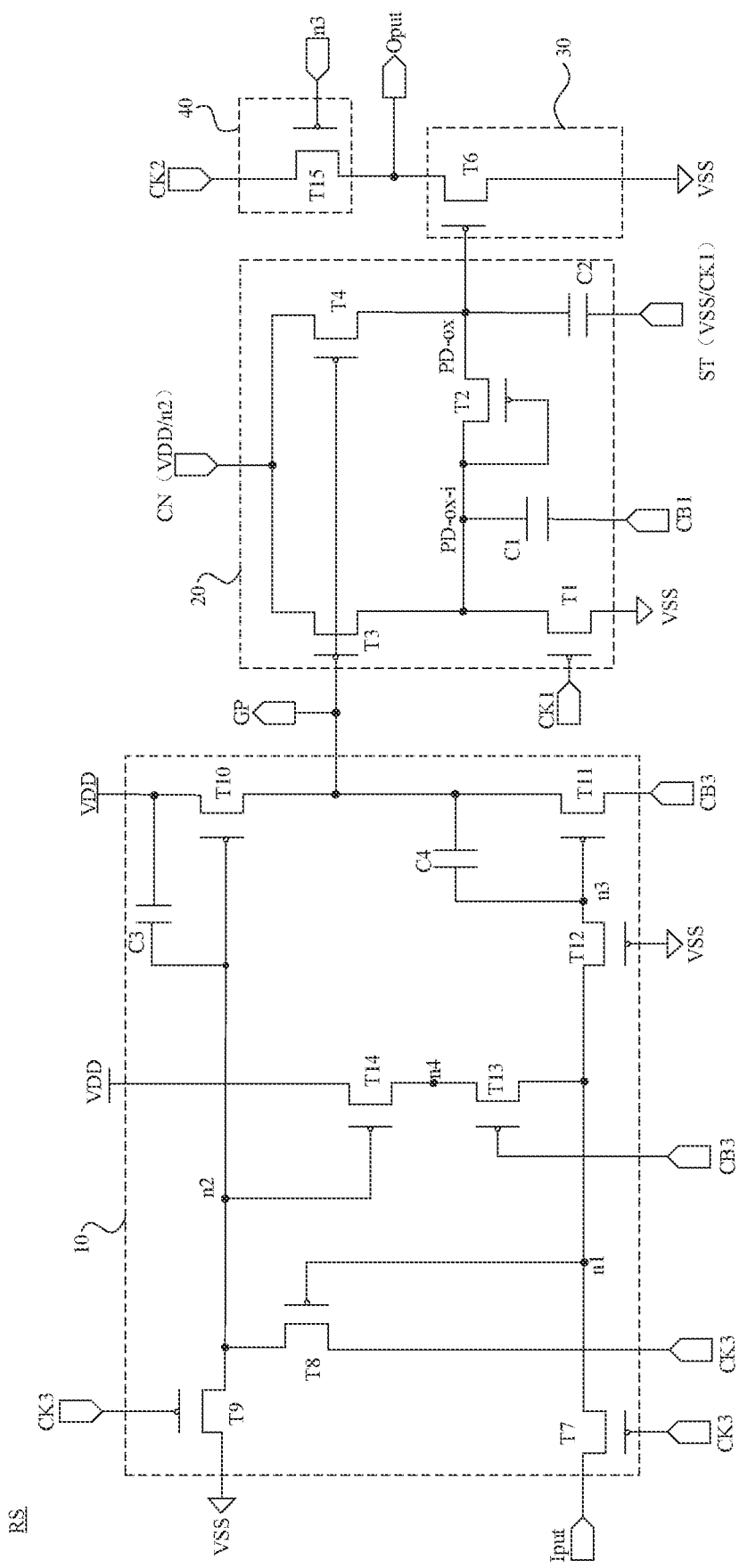
FIG. 11 is a diagram showing a structure of yet another shift register circuit, in accordance with embodiments of the present disclosure.

In some embodiments, as shown in FIG. 11, the denoising sub-circuit 30 includes a sixth transistor T6. A control electrode of the sixth transistor T6 is coupled to the first denoising control node PD-ox, a first electrode of the sixth transistor T6 is coupled to the first voltage terminal VSS, and a second electrode of the sixth transistor T6 is coupled to the scan signal output terminal Oput.

In the above embodiments, since the denoising control sub-circuit 20 may maintain the voltage of the first denoising control node PD-ox to be a stable voltage that enables the denoising sub-circuit 30 to be turned on in the holding phase, the sixth transistor T6 of the denoising sub-circuit 30 is continuously turned on, so that the voltage of the first voltage terminal VSS may be continuously transmitted to the scan signal output terminal Oput, and it is possible to ensure that the scan signal output terminal Oput is continuously denoised.

Figure 10:
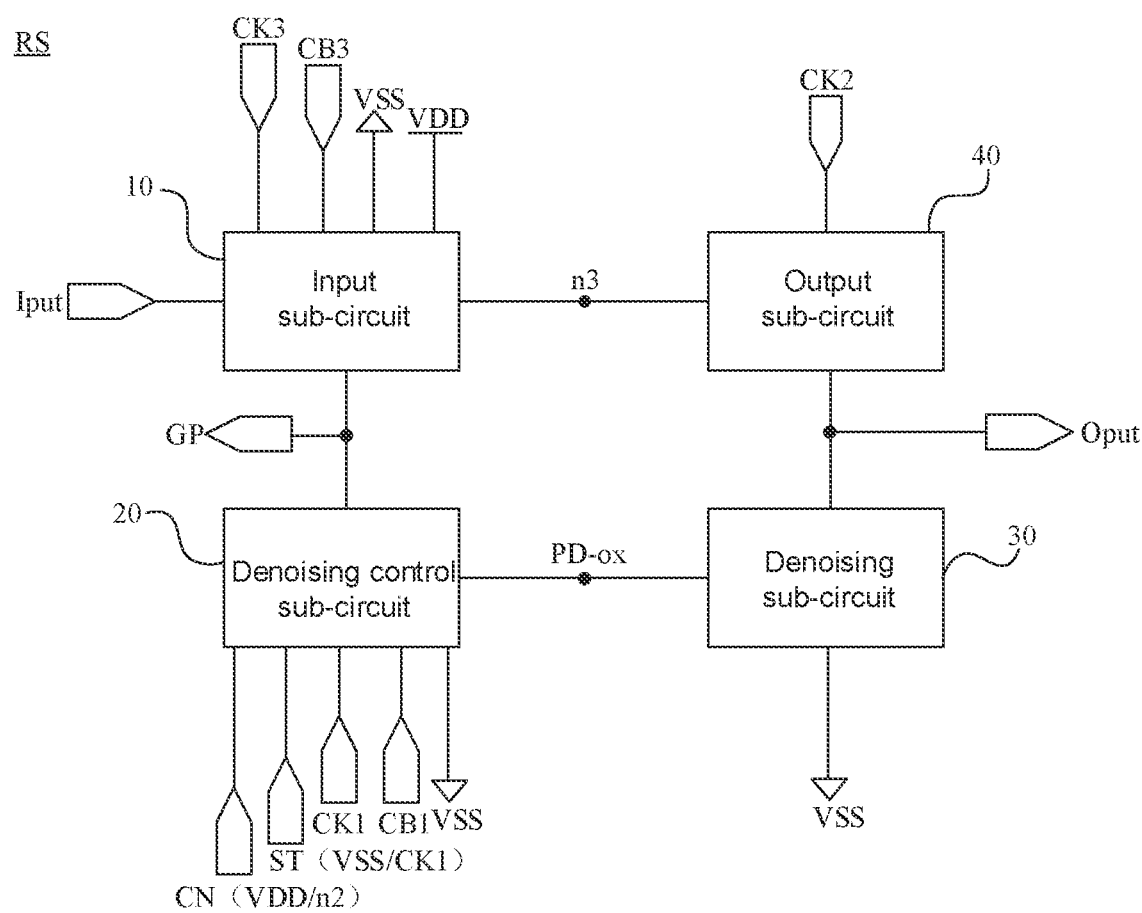
FIG. 10 is a diagram showing a structure of yet another shift register circuit, in accordance with embodiments of the present disclosure.

In some embodiments, as shown in FIG. 10, the shift register circuit RS further includes the input sub-circuit 10 and an output sub-circuit 40.

The input sub-circuit 10 and the denoising control sub-circuit 20 are coupled to the cascade signal output terminal GP, and is configured to control the voltage of the cascade signal output terminal GP, so as to enable the denoising sub-circuit to be turned on or turned off by the denoising control sub-circuit; the input sub-circuit 10 is further coupled to the output sub-circuit 40, and is further configured to transmit a turn-on signal to the output sub-circuit 40.

For example, in the output phase, the input sub-circuit 10 may control the voltage of the cascade signal output terminal GP to be a voltage that enables the turn-off control unit 22 to be turned on. In response to the voltage of the cascade signal output terminal GP, the turn-off control unit 22 transmits the signal of the second signal terminal CN to the first denoising control node PD-ox, so as to enable the denoising sub-circuit 30 to be turned off, and to ensure that the output of the scan signal at the scan signal output terminal Oput is not affected; in the holding phase, the input sub-circuit 10 may control the voltage of the cascade signal output terminal GP to be a voltage that enables the turn-off control unit 22 to be turned off, so as to enable the denoising sub-circuit 30 to be continuously turned on due to action of the turn-on control unit 21.

In addition, the input sub-circuit 10 is further coupled to an input signal terminal Iput, a third clock signal terminal CK3, a fourth clock signal terminal CB3, the first voltage terminal VSS, and the second voltage terminal VDD. The input sub-circuit 10 may receive a signal of the input signal terminal Iput under control of a signal of the third clock signal terminal CK3, and transmits the turn-on signal to the output sub-circuit 40 according to the received signal under control of the voltage of the first voltage terminal VSS.

Figure 13:
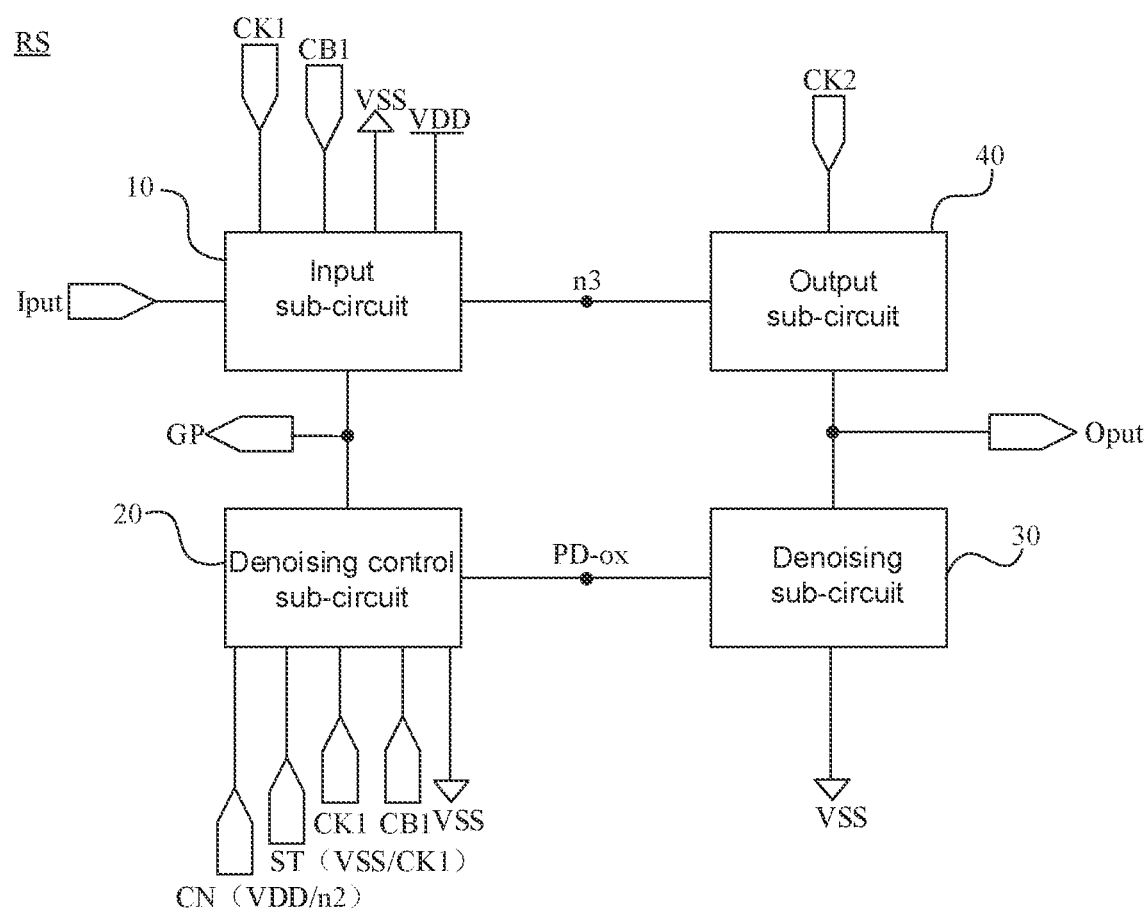
FIG. 13 is a diagram showing a structure of yet another shift register circuit, in accordance with embodiments of the present disclosure.

For example, the signal transmitted from the third clock signal terminal CK3 coupled to the input sub-circuit 10 may be same as the signal transmitted from the first clock signal terminal CK1; for example, the third clock signal terminal CK3 is coupled to the first clock signal terminal CK1. A signal transmitted from the fourth clock signal terminal CB3 may be same as the signal transmitted from the second clock signal terminal CB1; for example, the fourth clock signal terminal CB3 is coupled to the second clock signal terminal CB1. In this case, as shown in FIG. 13, it may be considered that the third clock signal terminal CK3 and the fourth clock signal terminal CB3 that are coupled to the input sub-circuit 10 are coupled to the first clock signal terminal CK1 and the second clock signal terminal CB1 respectively.

For example, the signal transmitted from the third clock signal terminal CK3 coupled to the input sub-circuit 10 is different from the signal transmitted from the first clock signal terminal CK1, and the signal transmitted from the fourth clock signal terminal CB3 is different from the signal transmitted from the second clock signal terminal CB1. That is, as shown in FIG. 10, the third clock signal terminal CK3 and the fourth clock signal terminal CB3 that are coupled to the input sub-circuit 10 are different from the first clock signal terminal CK1 and the second clock signal terminal CB1 that are coupled to the denoising control sub-circuit 20. That is to say, the input sub-circuit 10 and the denoising control sub-circuit 20 are controlled by different groups of clock signals, so that separate control of the input sub-circuit 10 and the denoising control sub-circuit 20 may be realized, thereby further ensuring effective control of the voltage of the first denoising control node PD-ox by the denoising control sub-circuit 20. In addition, a falling edge of the signal of the first clock signal terminal CK1 may be aligned with a rising edge of the signal of the fourth clock signal terminal CB3 and a falling edge of the signal of the scan signal output terminal Oput, so that a voltage of the scan signal output terminal Oput may be reset in time after the scan signal output terminal Oput outputs the scan signal.

The output sub-circuit 40 is coupled to the second voltage terminal VDD or a fifth clock signal terminal CK2, and FIG. 10 shows an example in which the output sub-circuit 40 is coupled to the fifth clock signal terminal CK2. The output sub-circuit 40 is further coupled to the scan signal output terminal Oput. The output sub-circuit 40 is configured to transmit the signal of the second voltage terminal VDD or a signal of the fifth clock signal terminal CK2 to the scan signal output terminal Oput in response to the turn-on signal transmitted by the input sub-circuit 10, so as to scan the gate line(s) coupled to the scan signal output terminal Oput.

For example, referring to FIG. 11, the input sub-circuit 10 includes a seventh transistor T7, an eighth transistor T8, a ninth transistor T9, a tenth transistor T10, a third capacitor C3, an eleventh transistor T11, a fourth capacitor C4, a twelfth transistor T12, a thirteenth transistor T13, and a fourteenth transistor T14.

A control electrode of the seventh transistor T7 is coupled to the third clock signal terminal CK3, a first electrode of the seventh transistor T7 is coupled to the signal input terminal Input, and a second electrode of the seventh transistor T7 is coupled to the first node n1.

A control electrode of the eighth transistor T8 is coupled to the first node n1, a first electrode of the eighth transistor T8 is coupled to the third clock signal terminal CK3, and a second electrode of the eighth transistor T8 is coupled to the second node n2.

A control electrode of the ninth transistor T9 is coupled to the third clock signal terminal CK3, a first electrode of the ninth transistor T9 is coupled to the first voltage terminal VSS, and a second electrode of the ninth transistor T9 is coupled to the second node n2.

A control electrode of the tenth transistor T10 is coupled to the second node n2, a first electrode of the tenth transistor T10 is coupled to the second voltage terminal VDD, and a second electrode of the tenth transistor T10 is coupled to the cascade signal output terminal GP.

A first terminal of the third capacitor C3 is coupled to the second node n2, and a second terminal of the third capacitor C3 is coupled to the first electrode of the tenth transistor T10 and the second voltage terminal VDD.

A control electrode of the eleventh transistor T11 is coupled to the third node n3, a first electrode of the eleventh transistor T11 is coupled to the fourth clock signal terminal CB3, and a second electrode of the eleventh transistor T11 is coupled to the cascade signal output terminal GP.

A first terminal of the fourth capacitor C4 is coupled to the third node n3, and a second terminal of the fourth capacitor C4 is coupled to the second electrode of the eleventh transistor T11 and the cascade signal output terminal GP.

A control electrode of the twelfth transistor T12 is coupled to the first voltage terminal VSS, a second electrode of the twelfth transistor T12 is coupled to the third node n3, and a first electrode of the twelfth transistor T12 is coupled to the first node n1.

A control electrode of the thirteenth transistor T13 is coupled to the fourth clock signal terminal CB3, a first electrode of the thirteenth transistor T13 is coupled to the first node n1, and a second electrode of the thirteenth transistor T13 is coupled to the fourth node n4.

A control electrode of the fourteenth transistor T14 is coupled to the second node n2, a first electrode of the fourteenth transistor T14 is coupled to the second voltage terminal VDD, and a second electrode of the fourteenth transistor T14 is coupled to the fourth node n4.

Figure 14:
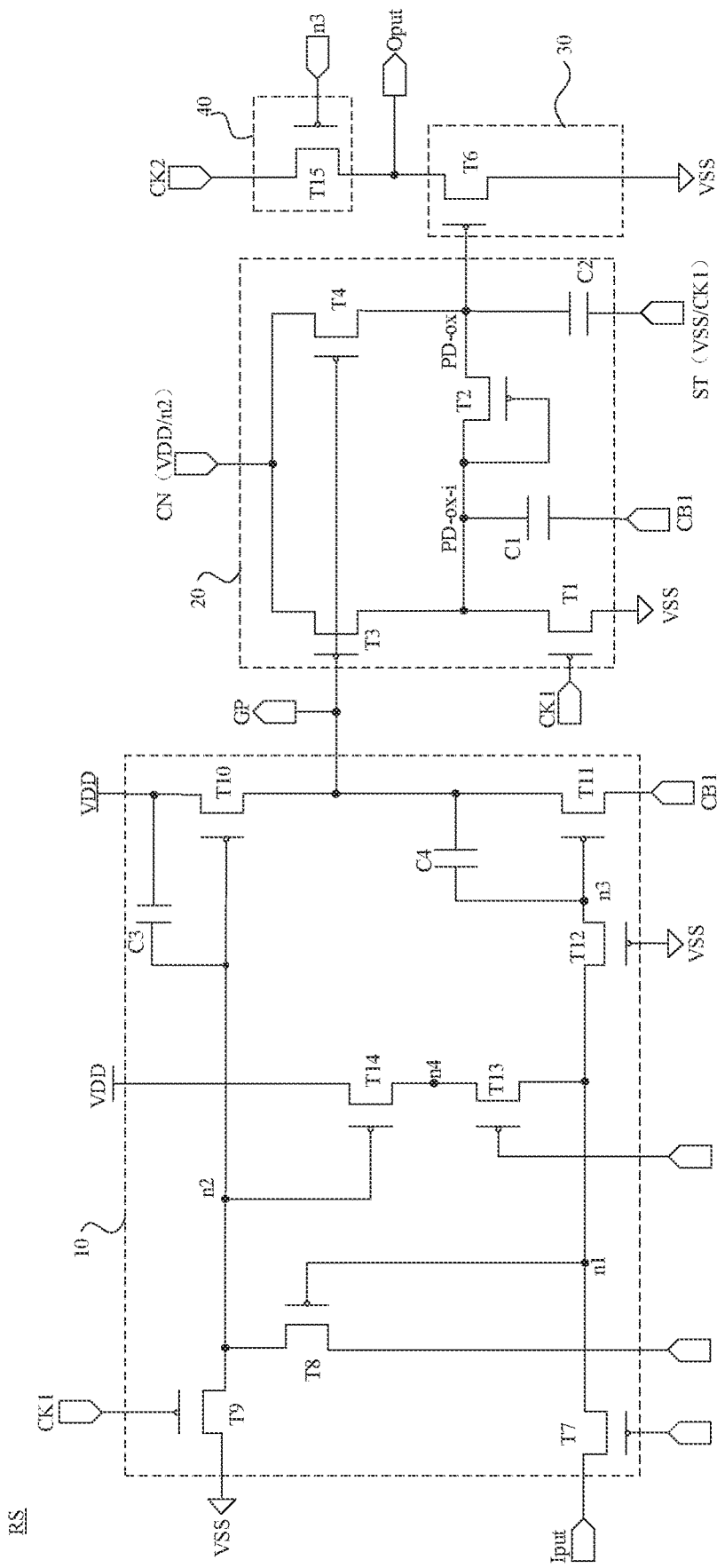
FIG. 14 is a diagram showing a structure of yet another shift register circuit, in accordance with embodiments of the present disclosure.

Based on the above embodiments, in a case where the signal transmitted from the third clock signal terminal CK3 coupled to the input sub-circuit 10 is same as the signal transmitted from the first clock signal terminal CK1, and the signal transmitted from the fourth clock signal terminal CB3 is same as the signal transmitted from the second clock signal terminal CB1 (that is, in a case where the third clock signal terminal CK3 and the fourth clock signal terminal CB3 that are coupled to the input sub-circuit 10 are coupled to the first clock signal terminal CK1 and the second clock signal terminal CB1, respectively), as shown in FIG. 14, the control electrode of the seventh transistor T7 included in the input sub-circuit 10 is coupled to the first clock signal terminal CK1, the first electrode of the eighth transistor T8 is coupled to the first clock signal terminal CK1, the control electrode of the ninth transistor T9 is coupled to the first clock signal terminal CK1, and the control electrode of the thirteenth transistor T13 is coupled to the second clock signal terminal CB1. In addition, for connection relationships of other electrodes of the above transistors and other transistors included in the input sub-circuit 10, reference may be made to the above embodiments corresponding to FIG. 11.

For example, referring to FIG. 11, the output sub-circuit 40 includes a fifteenth transistor T15. A control electrode of the fifteenth transistor T15 is coupled to the cascade signal output terminal GP or the third node n3 (FIG. 11 showing a case where the control electrode of the fifteenth transistor T15 is coupled to the third node n3), a first electrode of the fifteenth transistor T15 is coupled to the second voltage terminal VDD or the fifth clock signal terminal CK2 (FIG. 11 showing a case where the control electrode of the fifteenth transistor T15 is coupled to the fifth clock signal terminal CK2), and a second electrode of the fifteenth transistor T15 is coupled to the scan signal output terminal Oput.

It will be noted that, the transistors in the shift register circuit RS provided by the embodiments of the present disclosure may be thin film transistors (TFTs), field effect transistors (FETs) or other switching devices with same characteristics, and the embodiments of the present disclosure are all described by taking an example in which the transistors are the thin film transistors.

A control electrode of each thin film transistor in the shift register circuit RS is a gate of the transistor, a first electrode is one of a source and a drain of the thin film transistor, and a second electrode is the other of the source and the drain of the thin film transistor. Since the source and the drain of the thin film transistor may be symmetrical in structure, there may be no difference in structure between the source and the drain of the thin film transistor. That is to say, there may be no difference in structure between the first electrode and the second electrode of the thin film transistor in the embodiments of the present disclosure. For example, in a case where the thin film transistor is a P-type transistor, the first electrode of the thin film transistor is the source, and the second electrode of the thin film transistor is the drain; for example, in a case where the thin film transistor is an N-type transistor, the first electrode of the thin film transistor is the drain, and the second electrode of the thin film transistor is the source.

The shift register circuit RS provided by the embodiments of the present disclosure are all described by taking an example in which the thin film transistors are P-type transistors. It will be noted that, the embodiments of the present disclosure include but are not limited thereto. For example, one or more thin film transistors in the shift register circuit RS provided by the embodiments of the present disclosure may also be N-type transistor(s), as long as respective electrodes of a thin film transistor of a selected type may be correspondingly connected with reference to respective electrodes of a corresponding transistor in the embodiments of the present disclosure, and a corresponding voltage terminal may provide a corresponding high or low voltage.

In the embodiments of the present disclosure, specific implementation manners of the input sub-circuit 10, the denoising control sub-circuit 20, the denoising sub-circuit 30 and the output sub-circuit 40 are not limited to the manners described above, and may be any implementation manners used, such as conventional connection manners well known to a person skilled in the art, as long as corresponding functions may be realized. The above examples cannot limit the protection scope of the present disclosure. In practical applications, a person skilled in the art may choose to use or not to use one or more of the above circuits according to situations, and none of various combinations and modifications based on the above circuits depart from the principle of the present disclosure, and details will not be repeated herein.

In addition, in the embodiments of the present disclosure, the capacitors (e.g., the first capacitor C1, the second capacitor C2, the third capacitor C3, and the fourth capacitor C4 in FIG. 11) may be capacitor devices separately manufactured through a process. For example, the capacitor devices are each realized by manufacturing special capacitor electrodes, and each capacitor electrode of the capacitor may be realized through a metal layer, a semiconductor layer (e.g., doped with polysilicon), or the like. Alternatively, the capacitor may be realized through a parasitic capacitance between transistors, or through a transistor itself and another device or wire, or through a parasitic capacitance between wires of a circuit itself.

Based on the structures of the shift register circuit RS described in the above embodiments, some embodiments of the present disclosure provide a method for driving the shift register circuit RS.

Figure 12:
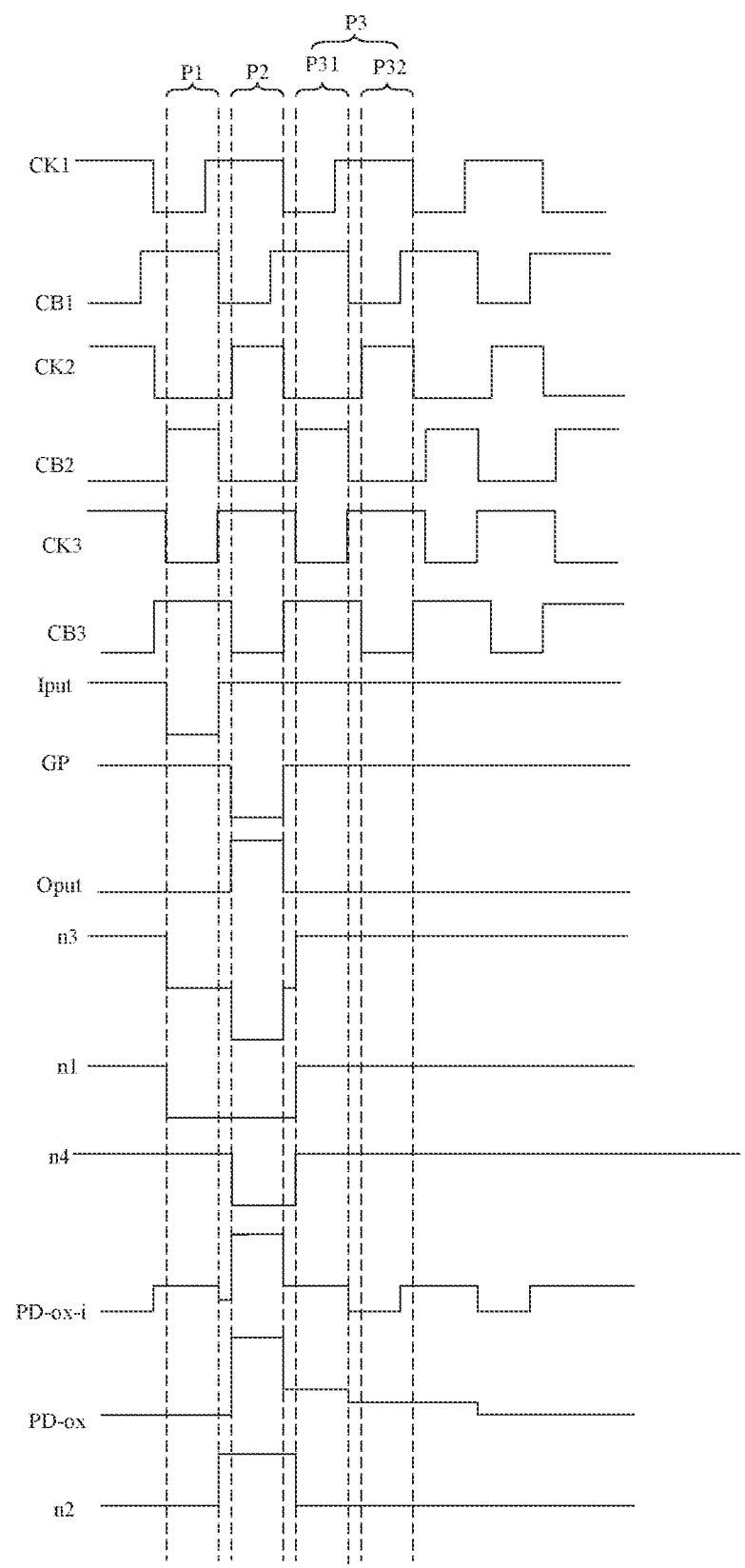
FIG. 12 is a diagram showing a driving timing of a shift register circuit, in accordance with embodiments of the present disclosure.

As shown in FIGS. 10 and 12, the driving process of the row of the gate line(s) includes an input phase P1, the output phase P2 and the holding phase P3.

In a case where the shift register circuit RS includes the input sub-circuit 10, the denoising control sub-circuit 20, the denoising sub-circuit 30 and the output sub-circuit 40, in the input phase P1, the input sub-circuit 10 controls the voltage of the cascade signal output terminal GP to be a first control voltage, so as to enable the denoising sub-circuit 30 to be turned on by the denoising control sub-circuit 20. The first control voltage refers to a voltage that enables the denoising sub-circuit 30 to be turned on by the denoising control sub-circuit 20 controlled by the cascade signal output terminal GP. For example, the first control voltage is equal to the voltage output from the second voltage terminal, so that the denoising control sub-circuit 20 controls the voltage of the first denoising control node PD-ox to be the voltage that enables the denoising sub-circuit 30 to be turned on, so as to enable the denoising sub-circuit 30 to be turned on. Moreover, the input sub-circuit 10 further transmits the turn-on signal to the output sub-circuit 40. For example, the input sub-circuit 10 receives the signal of the input signal terminal Iput under the control of the signal of the third clock signal terminal CK3, and the output sub-circuit 40 is turned on according to the received signal of the input signal terminal Iput.

In the output phase P2, the input sub-circuit 10 controls the voltage of the cascade signal output terminal GP to be a second control voltage, so as to enable the denoising sub-circuit 30 to be turned off by the denoising control sub-circuit 20. The second control voltage refers to a voltage that enables the denoising sub-circuit 30 to be turned off by the cascade signal output terminal GP controlled by the denoising control sub-circuit 20. For example, the second control voltage is equal to the voltage output from the first voltage terminal, so that the denoising control sub-circuit 20 controls the voltage of the first denoising control node PD-ox to be a voltage that enables the denoising sub-circuit 30 to be turned off. In addition, the input sub-circuit 10 continuously transmits the turn-on signal to the output sub-circuit 40.

For example, in the output phase, the output sub-circuit 40 may transmit the signal of the second voltage terminal VDD or the fifth clock signal terminal CK2 (FIG. 10 showing a case where the output sub-circuit 40 is coupled to the fifth clock signal terminal CK2) to the scan signal output terminal Oput under control of the turn-on signal, so as to scan the gate line coupled to the scan signal output terminal Oput.

In the holding phase P3, the denoising control sub-circuit 20 generates the alternating voltage signal according to the voltage of the first voltage terminal VSS and the signal of the second clock signal terminal CB1 in response to the signal of the first clock signal terminal CK1, and to rectify the alternating voltage signal, and then to output the signal to the first denoising control node PD-ox, so that the voltage of the first denoising control node PD-ox is maintained to be the voltage that enables the denoising sub-circuit 30 to be turned on. The denoising sub-circuit 30 is continuously turned on under control of the voltage of the first denoising control node PD-ox to denoise the scan signal output terminal Oput.

For example, a specific working process of the shift register circuit RS shown in FIG. 11 in the driving process of the row of the gate line(s) will be described in detail below with reference to FIG. 12. The following description will be described by taking an example in which the transistors in the shift register circuit RS are the P-type transistors (without considering influence of threshold voltages of the transistors), the voltage transmitted from the first voltage terminal VSS is a low voltage, and the voltage transmitted from the second voltage terminal VDD is a high voltage.

In addition, the following description will be described by taking an example in which the control electrode of the fifteenth transistor T15 is coupled to the third node n3, and the first electrode of the fifteenth transistor T15 is coupled to the fifth clock signal terminal CK2. In some other embodiments, the control electrode and the first electrode of the fifteenth transistor T15 may further be coupled to another node or signal terminal, respectively, for example, the control electrode of the fifteenth transistor T15 is coupled to the cascade signal output terminal GP, and the first electrode of the fifteenth transistor T15 is coupled to the second voltage terminal VDD.

As show in FIG. 12, the driving process of the row of the gate line(s) includes at least the input phase P1, the output phase P2 and the holding phase P3. The holding phase P3 includes at least a first holding period P31 and a second holding period P32.

For example, in the following description, "0" represents a low level, and "1" represents a high level.

In the input phase P1, Iput=0, CK1=0, CB1=1, CK2=0, CK3=0, and CB3=1.

In this case, the seventh transistor T7 is turned on under control of a low-level signal of the third clock signal terminal CK3, and the input signal terminal Iput outputs a low-level signal to the first node n1; the eighth transistor T8 is turned on under control of the low-level voltage of the first node n1; and the ninth transistor T9 is turned on under the control of the low-level signal of the third clock signal terminal CK3; therefore, the voltage of the second node n2 is a low voltage.

The tenth transistor T10 is turned on under control of the low voltage of the second node n2, and the high voltage VDD of the second voltage terminal VDD is transmitted to the cascade signal output terminal GP through the tenth transistor T10; the twelfth transistor T12 is turned on under control of the first voltage terminal VSS, and transmits the low voltage of the first node n1 to the third node n3 and the control electrode of the eleventh transistor T11, so that the eleventh transistor T11 is turned on, and transmits a high-level signal of the fourth clock signal terminal CB3 to the cascade signal output terminal GP; therefore, the voltage of the cascade signal output terminal GP is a high-level voltage $V_{DD}$.

At this time, the fourth capacitor C4 is charged, and a voltage of a terminal of the fourth capacitor C4 coupled to the third node n3 is a low voltage, and a voltage of a terminal of the fourth capacitor C4 coupled to the first electrode of the eleventh transistor T11 is a high voltage, so that receiving of the signal transmitted from the input signal terminal Input is realized.

The third transistor T3 and the fourth transistor T4 are both turned off under control of the high voltage of the cascade signal output terminal GP.

The first transistor T1 is turned on under control of a low signal output from the first clock signal terminal CK1, the voltage of the second denoising control node PD-ox-i is a low voltage $V_{SS}$, so that the second transistor T2 is turned on under control of the low voltage $V_{SS}$ of the second denoising control node PD-ox-i, and the voltage of the first denoising control node PD-ox is the low voltage $V_{SS}$; thus, the sixth transistor T6 is turned on, the voltage of the scan signal output terminal Oput is the low voltage $V_{SS}$, and the denoising of the scan signal output terminal Oput by the denoising sub-circuit 30 is realized.

In addition, the fourteenth transistor T14 is turned on under the control of the low voltage $V_{SS}$ of the second node n2, and transmits the high voltage of the second voltage terminal VDD coupled to the first electrode of the fourteenth transistor T14 to the fourth node n4. At this time, the thirteenth transistor T13 is turned off under control of the high signal of the fourth clock signal terminal CB3, so that a voltage of the fourth node n4 is the high voltage $V_{DD}$.

The fifteenth transistor T15 is turned on under control of the low voltage of the third node n3, and a low voltage output from the fifth clock signal terminal CK2 is transmitted to the scan signal output terminal Oput through the fifteenth transistor T15, so that the scan signal output terminal Oput outputs the low-level scan signal.

In the output phase P2, Iput=1, CK1=1, CB1=0, CK2=1, CK3=1, and CB3=0.

In this case, the seventh transistor T7 is turned off under control of a high-level signal of the third clock signal terminal CK3, and the voltage of the first node n1 is still the low voltage; the eighth transistor T8 is turned on under the control of the low voltage of the first node n1, so that the high-level signal of the third clock signal terminal CK3 is transmitted to the second node n2 through the eighth transistor T8; the ninth transistor T9 is turned off under the control of the high-level signal of the third clock signal terminal CK3; therefore, the voltage of the second node n2 is the high voltage.

The tenth transistor T10 is turned off under control of the high voltage of the second node n2; the twelfth transistor T12 is turned on under the control of the first voltage terminal VSS, and transmits the low voltage of the first node n1 to the third node n3 and the control electrode of the eleventh transistor T11, so that the eleventh transistor T11 is turned on, and transmits a low-level signal of the fourth clock signal terminal CB3 to the cascade signal output terminal GP; therefore, the voltage of cascade signal output terminal GP is a low voltage.

At this time, a voltage of a terminal of the fourth capacitor C4 coupled to the first electrode of the eleventh transistor T11 is the low voltage. Assuming that a voltage of the low-level signal of the fourth clock signal terminal CB3 is $V_{SS}$, and a voltage of the high-level signal is $V_{DD}$, the voltage of the terminal of the fourth capacitor C4 coupled to the first electrode of the eleventh transistor T11 drops from $V_{OO}$ in the input phase P1 to $V_{SS}$, and an amount of the voltage drop is ($V_{DD}$–$V_{SS}$) Due to a bootstrap effect of the fourth capacitor C4, the voltage of the third node n3 coupled to the other terminal of the fourth capacitor C4 is further pulled down by the amount of ($V_{DD}$–$V_{SS}$), and the voltage of the third node n3 drops from $V_{SS}$ in the input phase P1 to ($2V_{SS}$–$V_{DD}$).

The fifteenth transistor T15 is turned on under the control of the low voltage of the third node n3, so that a high voltage output from the fifth clock signal terminal CK2 is transmitted to the scan signal output terminal Oput through the fifteenth transistor T15, and the scan signal output terminal Oput outputs the high-level scan signal to scan the gate line.

The third transistor T3 and the fourth transistor T4 are both turned on under control of the low voltage of the cascade signal output terminal GP, so that the signal of the second signal terminal CN is transmitted to the second denoising control node PD-ox-i through the third transistor T3, and is transmitted to the first denoising control node PD-ox through the fourth transistor T4. Since the second signal terminal CN is the second voltage terminal VDD or the second node n2 (the voltage of the second node n2 in the output phase P2 being a high voltage), the voltages of the second denoising control node PD-ox-i and the first denoising control node PD-ox are both high voltages. Therefore, the sixth transistor T6 is turned off, and the output of the high-level scan signal at the scan signal output terminal Oput is not affected.

At this time, the first transistor T1 is turned off under control of a high-level signal output from the first clock signal terminal CK1, and the second transistor T2 is also turned off under control of the high voltage of the second denoising control node PD-ox-i.

In addition, the fourteenth transistor T14 is turned off under the control of the high voltage of the second node n2, and the thirteenth transistor T13 is turned on under control of the low-level signal of the fourth clock signal terminal CB3. Therefore, the voltage of the fourth node n4 is equal to the voltage (i.e., the low voltage) of the first node n1.

In the first holding period P31 of the holding phase P3, Iput=1, CK1=0, CB1=1, CK2=0, CK3=0, and CB3=1.

In this case, the seventh transistor T7 is turned on under the control of the low-level signal of the third clock signal terminal CK3, and a high-level signal of the signal input terminal Iput is transmitted to the first node n1 through the seventh transistor T7, so that the voltage of the first node n1 is changed to a high voltage; the eighth transistor T8 is turned off under control of the high voltage of the first node n1; the ninth transistor T9 is turned on under the control of the low-level signal of the third clock signal terminal CK3, and a low-level signal of the first signal terminal VSS is transmitted to the second node n2 through the ninth transistor T9, so that the voltage of the second node n2 is a low voltage $V_{SS}$.

The tenth transistor T10 is turned on under the control of the low voltage of the second node n2, so that the high voltage of the second voltage terminal VDD is transmitted to the cascade signal output terminal GP through the tenth transistor T10; the twelfth transistor T12 is turned on under the control of the first voltage terminal VSS, and transmits the high voltage of the first node n1 to the third node n3 and the control electrode of the eleventh transistor T11, so that the eleventh transistor T11 is turned off; therefore, the voltage of the cascade signal output terminal GP is a high voltage.

At this time, the third transistor T3 and the fourth transistor T4 are both turned off under the control of the high voltage of the cascade signal output terminal GP.

The first transistor T1 is turned on under the control of the low-level signal output from the first clock signal terminal CK1, so that the voltage of the second denoising control node PD-ox-i is the low voltage $V_{SS}$. A voltage of the terminal of the first capacitor C1 coupled to the second denoising control node PD-ox-i is the low voltage $V_{SS}$, and a voltage of the terminal of the first capacitor C1 coupled to the second clock signal terminal CB1 is a voltage of a high-level signal of the second clock signal terminal CB1. Assuming that the voltage of the high-level signal output from the second clock signal terminal CB1 is a high voltage $V_{DD}$, the voltage of the terminal of the first capacitor C1 coupled to the second clock signal terminal CB1 is the high voltage $V_{DD}$.

The second transistor T2 is turned on under the control of the low voltage $V_{SS}$ of the second denoising control node PD-ox-i, so that the voltage of the first denoising control node PD-ox is the low voltage $V_{SS}$; thus, the sixth transistor T6 is turned on, the voltage of the scan signal output terminal Oput is the low voltage $V_{SS}$, and the denoising of the scan signal output terminal Oput by the denoising sub-circuit 30 is realized.

In addition, the fourteenth transistor T14 is turned on under the control of the low voltage $V_{SS}$ of the second node n2, and transmits the high voltage $V_{DD}$ of the second voltage terminal VDD coupled to the first electrode of the fourteenth transistor T14 to the fourth node n4. At this time, the thirteenth transistor T13 is turned off under the control of the high-level signal of the fourth clock signal terminal CB3, so that the voltage of the fourth node n4 is the high voltage $V_{OD}$.

The fifteenth transistor T15 is turned off under control of the high voltage of the third node n3.

In the second holding period P32 of the holding phase P3, Iput=1, CK1=1, CB1=0, CK2=1, CK3=1, and CB3=0.

In this case, the seventh transistor T7 is turned off under the control of the high-level signal of the third clock signal terminal CK3, so that the voltage of the first node n1 is still the high voltage, and the eighth transistor T8 is still turned off under the control of the high voltage of the first node n1. The ninth transistor T9 is turned off under the control of the high-level signal of the third clock signal terminal CK3, so that the voltage of the second node n2 is still the low voltage.

The tenth transistor T10 is turned on under the control of the low voltage of the second node n2, so that the high voltage of the second voltage terminal VDD is transmitted to the cascade signal output terminal GP through the tenth transistor T10; the twelfth transistor T12 is turned on under the control of the first voltage terminal VSS, and transmits the high voltage of the first node n1 to the third node n3 and the control electrode of the eleventh transistor T11, so that the eleventh transistor T11 is turned off; therefore, the voltage of the cascade signal output terminal GP is the high voltage.

At this time, the third transistor T3 and the fourth transistor T4 are both turned off under the control of the high voltage of the cascade signal output terminal GP.

The first transistor T1 is turned off under the control of the high-level signal output from the first clock signal terminal CK1, and the second denoising control node PD-ox-i is in a floating state. The voltage of the terminal of the first capacitor C1 coupled to the second clock signal terminal CB1 is a voltage of a low-level signal of the second clock signal terminal CB1. That is, the voltage of the terminal of the first capacitor C1 coupled to the second clock signal terminal CB1 is the low voltage $V_{SS}$. Then, the voltage of the terminal of the first capacitor C1 coupled to the second clock signal terminal CB1 drops from $V_{DD}$ in the first holding period P31 to the low voltage $V_{SS}$, and an amount of the voltage drop is ($V_{SS}$–$V_{DD}$).

Due to the coupling effect of the first capacitor C1, the voltage of the second denoising control node PD-ox-i shifts, and a shift amount is $$\frac{(V_{SS} - V_{DD}) \times C_1}{C_{PD-ox-i}},$$

in which $C_{PD-ox-i}$ is a total capacitance of the devices (including the transistors T1, T2 and T3 and the capacitor C1) connected to the second denoising control node PD-ox-i, and $C_1$ is a capacitance of the first capacitor C1, so that the voltage of the second denoising control node PD-ox-i drops from $V_{SS}$ in the first holding period P31 to $$V_{SS} + \frac{(V_{SS} - V_{DD}) \times C_1}{C_{PD-ox-i}}.$$

At this time, since the voltage of the first denoising control node PD-ox is the low voltage $V_{SS}$, and the voltage of the second denoising control node PD-ox-i is $$V_{SS} + \frac{(V_{SS} - V_{DD}) \times C_1}{C_{PD-ox-i}},$$

the second transistor T2 is turned on, so that approximately half of electric charge flows from the first denoising control node PD-ox into the second denoising control node PD-ox-i. That is, the first denoising control node PD-ox and the second denoising control node PD-ox-i share the voltage equally, so that the voltage of the first denoising control node PD-ox is changed to $$\left[2V_{SS} + \frac{(V_{SS} - V_{DD}) \times C_1}{C_{PD-ox-i}}\right]/2.$$

That is to say, the voltage of the first denoising control node PD-ox is pulled down from $V_{SS}$ in the first holding period P31 to $$\left[2V_{SS} + \frac{(V_{SS} - V_{DD}) \times C_1}{C_{PD-ox-i}}\right]/2.$$

Thereafter, the signals of the first clock signal terminal CK1 and the second clock signal terminal CB1 are alternately a high-level signal and a low-level signal respectively. That is, in the holding phase P3, the first holding period P31 and the second holding period P32 are alternately performed. Therefore, the first denoising control node PD-ox and the second denoising control node PD-ox-i are coupled for multiple times, and the voltage is averaged for multiple times; finally, the voltage of the first denoising control node PD-ox is stabilized around a certain voltage, and change of the voltage of the first denoising control node PD-ox is shown by the waveform in FIG. 12, so that the sixth transistor T6 is continuously turned on in the holding phase P3, and the scan signal output terminal Oput is continuously denoised.

For example, in a case where $C_1$ is sufficiently large, and $C_{PD-ox-i}$ is considered to be approximately equal to $C_1$ ($C_{PD-ox-i} \approx C_1$) (which may be understood to mean that $C_1$ occupies a large proportion of $C_{PD-ox-i}$, e.g., a proportion greater than or equal to 90%), for numerical values involved in the above derivation, reference may be made to the following description.

Due to the coupling effect of the first capacitor C1, a shift amount of the voltage of the second denoising control node PD-ox-i is ($V_{SS}$–$V_{DD}$), so that the voltage of the second denoising control node PD-ox-i drops from $V_{SS}$ in the first holding period P31 to ($V_{SS}$+($V_{SS}$–$V_{DD}$)=$2V_{SS}$–$V_{DD}$).

At this time, since the voltage of the first denoising control node PD-ox is the low voltage $V_{SS}$, and the voltage of the second denoising control node PD-ox-i is ($2V_{SS}$–$V_{DD}$), the second transistor T2 is turned on, and approximately half of the electric charge flows from the first denoising control node PD-ox into the second denoising control node PD-ox-i. As a result, the voltage of the first denoising control node PD-ox is changed to ([($2V_{SS}$–$V_{DD}$) $V_{SS}$]/2=($3V_{SS}$–$V_{DD}$)/2). That is, the voltage of the first denoising control node PD-ox is pulled down from $V_{SS}$ in the first holding period P31 to (($3V_{SS}$–$V_{DD}$)/2).

Thereafter, the signals of the first clock signal terminal CK1 and the second clock signal terminal CB1 are alternately the high-level signal and the low-level signal respectively. That is, in the holding phase P3, the first holding period P31 and the second holding period P32 are alternately performed. Therefore, the first denoising control node PD-ox and the second denoising control node PD-ox-i are coupled for multiple times, and the voltage is averaged for multiple times; finally, the voltage of the first denoising control node PD-ox is stabilized around ($2V_{SS}$–$V_{DD}$), so that the sixth transistor T6 is continuously turned on in the holding phase P3, and the scan signal output terminal Oput is continuously denoised.

In addition, in the second holding period P32, the fourteenth transistor T14 is turned on under the control of the low voltage of the second node n2, and transmits the high voltage $V_{DD}$ of the second voltage terminal VDD coupled to the first electrode of the fourteenth transistor T14 to the fourth node n4. At this time, the thirteenth transistor T13 is turned on under the control of the low-level signal of the fourth clock signal terminal CB3, so that the voltage of the fourth node n4 is the high voltage $V_{DD}$. Thus, through joint control over the second voltage terminal VDD by the thirteenth transistor T13 and the fourteenth transistor T14 to charge the first node n1, the voltage of the first node n1 may be maintained to be the high voltage, and it may be possible to ensure that the eleventh transistor T11 is in a turn-off state.

The fifteenth transistor T15 is turned off under the control of the high voltage of the third node n3.

Figure 15:
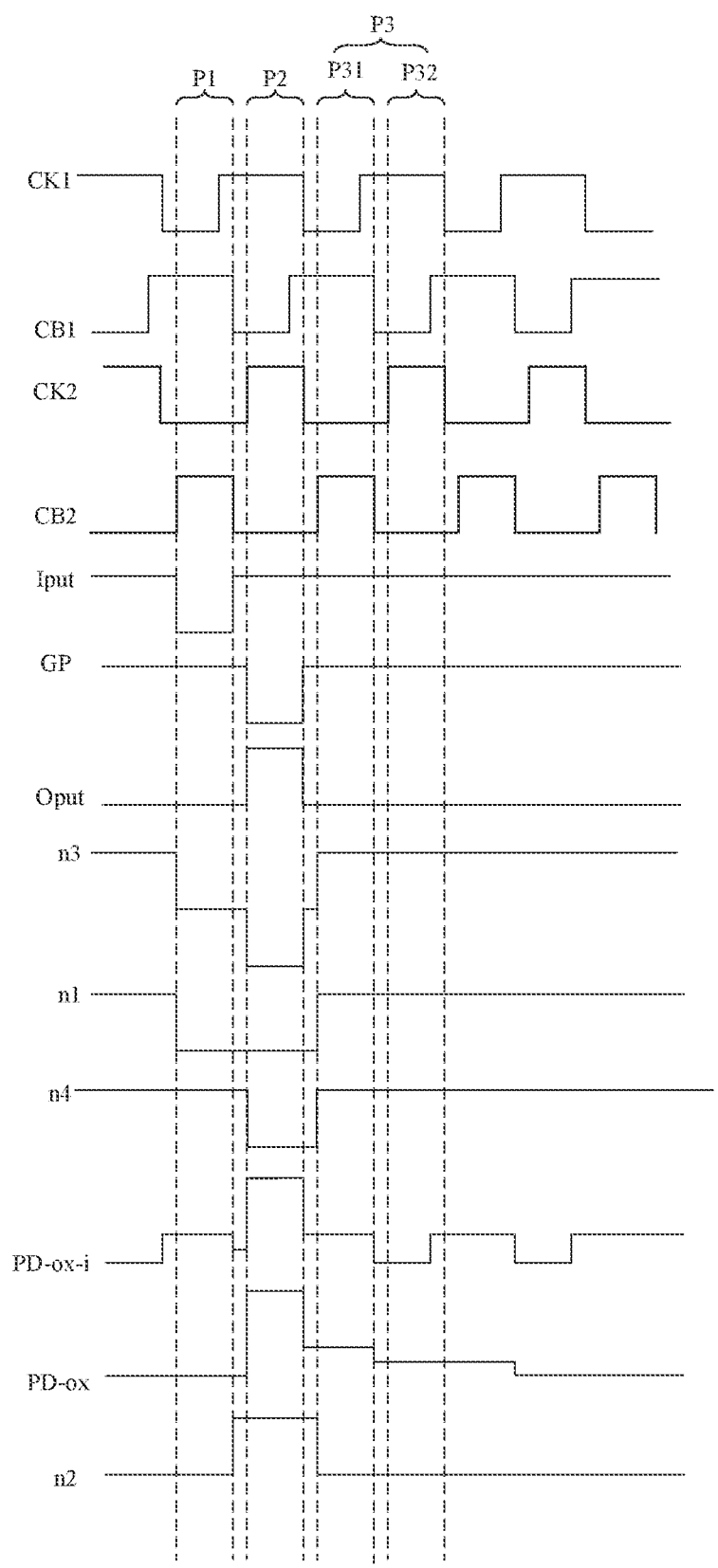
FIG. 15 is a diagram showing a driving timing of another shift register circuit, in accordance with embodiments of the present disclosure.

In some other embodiments, as shown in FIGS. 13 and 14, for the case where the third clock signal terminal CK3 and the fourth clock signal terminal CB3 that are coupled to the input sub-circuit 10 in the shift register circuit RS are coupled to the first clock signal terminal CK1 and the second clock signal terminal CB1 respectively, a driving timing of the shift register circuit RS may be shown in FIG. 15; for a specific driving process of the circuit, reference may be made to the above description, and details will not be repeated herein.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register circuit, comprising
a denoising control sub-circuit and a denoising sub-circuit;
wherein the denoising, control sub-circuit is coupled to a first voltage terminal, a first clock signal terminal, a second clock signal terminal and a first denoising control node;
the denoising control sub-circuit is configured to:
generate an alternating voltage signal according to a voltage of the first voltage terminal and a signal of the second clock signal terminal in response to a signal of the first clock signal terminal;
rectify the alternating voltage signal; and
output a signal to the first denoising control node, so that a voltage of the first denoising control node is maintained to be a voltage that enables the denoising sub-circuit to be turned on;
the denoising sub-circuit is coupled to the first denoising control node and a scan signal output terminal; and
the denoising sub-circuit is configured to denoise the scan signal output terminal in response to the voltage of the first denoising control node being the voltage that enables the denoising sub-circuit to be turned on,
wherein the denoising control sub-circuit includes:
a first turn-on control sub-circuit, the first turn-on control sub-circuit being coupled to the first clock signal terminal, the second clock signal terminal, the first voltage terminal, and a second denoising control node, and being configured to output the voltage of the first voltage terminal to the second denoising control node periodically in response to the signal of the first clock signal terminal, and to adjust a voltage of the second denoising control node periodically according to the signal of the second clock signal terminal, so that the second denoising control node provides the alternating voltage signal; and
a second turn-on control sub-circuit, the second turn-on control sub-circuit being coupled to the first denoising control node and the second denoising control node and being configured to, in response to the alternating voltage signal provided by the second denoising control node, rectify the alternating voltage signal, and then output the signal to the first denoising control node,
wherein the first turn-on control sub-circuit includes:
a first transistor, a control electrode of the first transistor being coupled to the first clock signal terminal, a first electrode of the first transistor being coupled to the first voltage terminal, and a second electrode of the first transistor being coupled to the second denoising control node;
a first capacitor, a first terminal of the first capacitor being coupled to a second electrode of a fifth transistor, and a second terminal of the first capacitor being coupled to the second denoising control node; and
the fifth transistor, a control electrode of the fifth transistor being coupled to the scan signal output terminal, and a first electrode of the fifth transistor being coupled to the second clock signal terminal; and
the second turn-on control sub-circuit includes:
a second transistor, a control electrode of the second transistor being coupled to the second denoising control node, a first electrode of the second transistor being coupled to the first denoising control node, and a second electrode of the second transistor being coupled to the second denoising control node; and
a second capacitor, a first terminal of the second capacitor being coupled to a first signal terminal, and a second terminal of the second capacitor being coupled to the first denoising control node.

2. The shift register circuit according to claim 1, wherein the denoising control sub-circuit is further coupled to a cascade signal output terminal and a second signal terminal, and is further configured to control the denoising sub-circuit to be turned off according to a signal of the second signal terminal in response to a voltage of the cascade signal output terminal.

3. The shift register circuit according to claim 2, wherein the denoising control sub-circuit further includes:
a turn-off control unit coupled to a cascade signal output terminal and a second signal terminal;
wherein the turn-off control unit includes:
a third transistor, a control electrode of the third transistor being coupled to the cascade signal output terminal, a first electrode of the third transistor being coupled to the second signal terminal, and a second electrode of the third transistor being coupled to the second denoising control node; and
a fourth transistor, a control electrode of the fourth transistor being coupled to the cascade signal output terminal, a first electrode of the fourth transistor being coupled to the second signal terminal, and a second electrode of the fourth transistor being coupled to the first denoising control node.

4. The shift register circuit according to claim 2, further comprising: an input sub-circuit, the input sub-circuit being coupled to the cascade signal output terminal, and being configured to control the voltage of the cascade signal output terminal, so as to enable the denoising sub-circuit to be turned on or turned off by the denoising control sub-circuit.

5. The shift register circuit according to claim 4, wherein the input sub-circuit includes:
- a seventh transistor, a control electrode of the seventh transistor being coupled to a third clock signal terminal, a first electrode of the seventh transistor being coupled to a signal input terminal, and a second electrode of the seventh transistor being coupled to a first node;
- an eighth transistor, a control electrode of the eighth transistor being coupled to the first node, a first electrode of the eighth transistor being coupled to the third clock signal terminal, and a second electrode of the eighth transistor being coupled to a second node;
- a ninth transistor, a control electrode of the ninth transistor being coupled to the third clock signal terminal, a first electrode of the ninth transistor being coupled to the first voltage terminal, and a second electrode of the ninth transistor being coupled to the second node;
- a tenth transistor, a control electrode of the tenth transistor being coupled to the second node, a first electrode of the tenth transistor being coupled to a second voltage terminal, and a second electrode of the tenth transistor being coupled to the cascade signal output terminal;
- a third capacitor, a first terminal of the third capacitor being coupled to the second node, and a second terminal of the third capacitor being coupled to the first electrode of the tenth transistor and the second voltage terminal;
- an eleventh transistor, a control electrode of the eleventh transistor being coupled to a third node, a first electrode of the eleventh transistor being coupled to a fourth clock signal terminal, and a second electrode of the eleventh transistor being coupled to the cascade signal output terminal;
- a fourth capacitor, a first, terminal of the fourth capacitor being coupled to the third node, and a second terminal of the fourth capacitor being coupled to the second electrode of the eleventh transistor and the cascade signal output terminal;
- a twelfth transistor, a control electrode of the twelfth transistor being coupled to the first voltage terminal, a second electrode of the twelfth transistor being coupled to the third node, and a first electrode of the twelfth transistor being coupled to the first node;
- a thirteenth transistor, a control electrode of the thirteenth transistor being coupled to the fourth clock signal terminal, a first electrode of the thirteenth transistor being coupled to the first node, and a second electrode of the thirteenth transistor being coupled to a fourth node; and
- a fourteenth transistor, a control electrode of the fourteenth transistor being coupled to the second node, a first electrode of the fourteenth transistor being coupled to the second voltage terminal, and a second electrode of the fourteenth transistor being coupled to the fourth node.

6. The shift register circuit according to claim 5, wherein the second signal terminal is coupled to the second voltage terminal, or the second signal terminal is coupled to a second node.

7. The shift register circuit according to claim 5, wherein the third clock signal terminal is coupled to the first clock signal terminal, and the fourth clock signal terminal is coupled to the second clock signal terminal.

8. The shift register circuit according to claim 4, further comprising an output sub-circuit, wherein the input sub-circuit is further coupled to the output sub-circuit, and the input sub-circuit is further configured to transmit a turn-on signal to the output sub-circuit; and
- the output sub-circuit is further coupled to a second voltage terminal or a fifth clock signal terminal, and is further coupled to the scan signal output terminal, and is configured to transmit a signal of the second voltage terminal or the fifth clock signal terminal to the scan signal output terminal in response to the turn-on signal transmitted by the input sub-circuit; or
- the output sub-circuit is further coupled to a second voltage terminal or a fifth clock signal terminal, and is further coupled to the scan signal output terminal, and is configured to transmit a signal of the second voltage terminal or the fifth clock signal terminal to the scan signal output terminal in response to the turn-on signal transmitted by the input sub-circuit;
- wherein the output sub-circuit includes a fifteenth transistor, a control electrode of the fifteenth transistor being coupled to the input sub-circuit through the cascade signal output terminal or a third node, a first electrode of the fifteenth transistor being coupled to the second voltage terminal or the fifth clock signal terminal, and a second electrode of the fifteenth transistor being coupled to the scan signal output terminal.

9. The shift register circuit according to claim 1, wherein the first signal terminal is coupled to the first voltage terminal or the first clock signal terminal.

10. The shift register circuit according to claim 1, wherein the denoising sub-circuit includes:
- a sixth transistor, a control electrode of the sixth transistor being coupled to the first denoising control node, a first electrode of the sixth transistor being coupled to the first voltage terminal, and a second electrode of the sixth transistor being coupled to the scan signal output terminal.

11. A gate driving circuit, comprising a plurality of cascaded shift register circuits, wherein the shift register circuits are shift register circuits each according to claim 1.

12. A display apparatus, comprising:
- a plurality of gate lines; and
- the gate driving circuit according to claim 11;
- wherein each shift register circuit in the gate driving circuit is coupled to at least one gate line.

13. A method for driving the shift register circuit according to claim 1, the driving method comprising:
- in a holding phase:
  - generating, by the denoising control sub-circuit of the shift register circuit, the alternating voltage signal according to the voltage of the first voltage terminal and the signal of the second clock signal terminal in response to the signal of the first clock signal terminal;
  - rectifying, by the denoising control sub-circuit, the alternating voltage signal; and outputting, by the denoising control sub-circuit, the signal to the first denoising control node, so that the voltage of the first denoising control node is maintained to be the voltage that enables the denoising sub-circuit to be turned on; and
  - denoising, by the denoising sub-circuit, the scan signal output terminal in response to the voltage of the first denoising control node being the voltage that enables the denoising sub-circuit to be turned on,
- wherein the holding phase includes first holding periods and second holding periods that are alternately performed;

in a first holding period:
the first transistor is turned on under control of the signal of the first clock signal terminal, so that the voltage of the first voltage terminal is transmitted to the second denoising control node through the first transistor;
the first capacitor stores the voltage of the second denoising control node;
the second transistor is turned on under control of the voltage of the second denoising control node, so that the voltage of the first voltage terminal is transmitted to the first denoising control node through the second transistor;
the second capacitor stores the voltage of the first denoising control node; and
the denoising sub-circuit is turned on under control of the voltage of the first denoising control node; and
in a second holding period:
the first transistor is turned off under the control of the signal of the first clock signal terminal so that the second denoising control node is in a floating state;
the fifth transistor is turned on under control of a signal of the scan signal output terminal, so that the signal of the second clock signal terminal is transmitted to the first terminal of the first capacitor through the fifth transistor;
due to a coupling effect of the first capacitor in response to the signal of the second clock signal terminal the voltage of the second denoising control node shifts;
the second transistor is kept in an on state in response to the voltage of the first denoising control node and the voltage of the second denoising control node so that the first denoising control node and the second denoising control node share the voltages thereof equally; and
the denoising sub-circuit is kept in an on state under the control of the voltage of the first denoising control node.

14. The driving method according to claim 13, wherein the shift register circuit further includes an input sub-circuit, the input sub-circuit and the denoising control sub-circuit are coupled to a cascade signal output terminal, the driving method further comprising:
in an input phase:
controlling, by the input sub-circuit, a voltage of the cascade signal output terminal to be a first control voltage in response to a signal of a third clock signal terminal coupled to the input sub-circuit, so as to enable the denoising sub-circuit to be turned on by the denoising control sub-circuit;
in an output phase:
controlling, by the input sub-circuit, the voltage of the cascade signal output terminal to be a second control voltage, so as to enable the denoising sub-circuit to be turned off by the denoising, control sub-circuit.

15. A shift register circuit, comprising:
a first transistor, a control electrode of the first transistor being coupled to a first clock signal terminal, a first electrode of the first transistor being coupled to a first voltage terminal, and a second electrode of the first transistor being coupled to a second denoising control node;
a first capacitor, a first terminal of the first capacitor being coupled to a second electrode of a fifth transistor, and a second terminal of the first capacitor being coupled to the second denoising control node;
the fifth transistor, a control electrode of the fifth transistor being coupled to the scan signal output terminal, and a first electrode of the fifth transistor being coupled to the second clock signal terminal,
a second transistor, a control electrode of the second transistor being coupled to the second denoising control node, a first electrode of the second transistor being coupled to a first denoising control node, and a second electrode of the second transistor being coupled to the second denoising control node;
a second capacitor, a first terminal of the second capacitor being coupled to a first signal terminal, and a second terminal of the second capacitor being coupled to the first denoising control node; and
a sixth transistor, a control electrode of the sixth transistor being coupled to the first denoising control node, a first electrode of the sixth transistor being coupled to the first voltage terminal, and a second electrode of the sixth transistor being coupled to a scan signal output terminal.

16. The shift register circuit according to claim 15, further comprising:
a third transistor, a control electrode of the third transistor being coupled to a cascade signal output terminal, a first electrode of the third transistor being coupled to a second signal terminal, and a second electrode of the third transistor being coupled to the second denoising control node; and
a fourth transistor, a control electrode of the fourth transistor being coupled to the cascade signal output terminal, a first electrode of the fourth transistor being coupled to the second signal terminal, and a second electrode of the fourth transistor being coupled to the first denoising control node.

17. A shift register circuit, comprising
a denoising control sub-circuit, a denoising sub-circuit, an input sub-circuit and an output sub-circuit;
wherein the denoising control sub-circuit is coupled to a first voltage terminal, a first clock signal terminal, a second clock signal terminal and a first denoising control node; and
the denoising control sub-circuit is configured to:
generate an alternating voltage signal according to a voltage of the first voltage terminal and a signal of the second clock signal terminal in response to a signal of the first clock signal terminal;
rectify the alternating voltage signal; and
output a signal to the first denoising control node, so that a voltage of the first denoising control node is maintained to be a voltage that enables the denoising sub-circuit to be turned on;
the denoising control sub-circuit is further coupled to a cascade signal output terminal and a second signal terminal; and
the denoising control sub-circuit is further configured to control the denoising sub-circuit to be turned off according to a signal of the second signal terminal in response to a voltage of the cascade signal output terminal;
the denoising sub-circuit is coupled to the first denoising control node and a scan signal output terminal; and
the denoising sub-circuit is configured to denoise the scan signal output terminal in response to the voltage of the first denoising control node being the voltage that enables the denoising sub-circuit to be turned on;
the input sub-circuit is coupled to the cascade signal output terminal and the output sub-circuit; the input sub-circuit is configured to control the voltage of the cascade signal output terminal; so as to enable the denoising sub-circuit to be turned on or turned off by the denoising control sub-circuit; and the input sub-circuit is further configured to transmit a turn-on signal to the output sub-circuit; and the output sub-circuit is further coupled to a fifth clock signal terminal and the scan signal output terminal; and the output sub-circuit is configured to transmit a signal of the fifth clock signal terminal to the scan signal output terminal in response to the turn-on signal transmitted by the input sub-circuit, wherein the output sub-circuit includes a fifteenth transistor, a control electrode of the fifteenth transistor is coupled to the output sub-circuit, a first electrode of the fifteenth transistor is coupled to the fifth clock signal terminal, and a second electrode of the fifteenth transistor is coupled to the scan signal output terminal.

18. A method for driving the shift register circuit according to claim 17, the driving method comprising:

in a holding phase:
  generating, by the denoising control sub-circuit of the shift register circuit; the alternating voltage signal according to the voltage of the first voltage terminal and the signal of the second clock signal terminal in response to the signal of the first clock signal terminal;
  rectifying, by the denoising control sub-circuit, the alternating voltage signal; and
  outputting, by the denoising control sub-circuit, the signal to the first denoising control node, so that the voltage of the first denoising control node is maintained to be the voltage that enables the denoising, sub-circuit to be turned on; and denoising, by the denoising sub-circuit, the scan signal output terminal in response to the voltage of the first denoising control node being the voltage that enables the denoising sub-circuit to be turned on;

in an input phase:
controlling, by the input sub-circuit, a voltage of the cascade signal output terminal to be a first control voltage in response to a signal of a third clock signal terminal coupled to the input sub-circuit, so as to enable the denoising sub-circuit, to be turned on by the denoising control sub-circuit; and in an output phase:
controlling, by the input sub-circuit, the voltage of the cascade signal output terminal to be a second control voltage, so as to enable the denoising sub-circuit to be turned off by the denoising control sub-circuit; and transmitting, by the input sub-circuit, the turn-on signal to the output sub-circuit; and transmitting, by the output sub-circuit, the signal of the fifth clock signal terminal to the scan signal output terminal in response to the turn-on signal, wherein the fifteenth transistor is turned on under control of the turn-on signal, so that the signal of the fifth clock signal terminal is transmitted to the scan signal output terminal through the fifteenth transistor.

* * * * *